United States Patent
Lin et al.

(10) Patent No.: US 12,446,230 B2
(45) Date of Patent: Oct. 14, 2025

(54) FERROELECTRIC MEMORY DEVICE AND MEMORY ARRAY

(71) Applicant: Taiwan Semiconductor Manufacturing Company, Ltd., Hsinchu (TW)

(72) Inventors: Meng-Han Lin, Hsinchu (TW); Chia-En Huang, Hsinchu County (TW); Sai-Hooi Yeong, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 417 days.

(21) Appl. No.: 18/178,529

(22) Filed: Mar. 5, 2023

(65) Prior Publication Data

US 2024/0138153 A1  Apr. 25, 2024

Related U.S. Application Data

(60) Provisional application No. 63/417,676, filed on Oct. 19, 2022.

(51) Int. Cl.
*H10B 51/30* (2023.01)
*H10B 12/00* (2023.01)
*H10B 51/20* (2023.01)
*H10D 64/27* (2025.01)

(52) U.S. Cl.
CPC .......... *H10B 51/30* (2023.02); *H10B 12/20* (2023.02); *H10B 12/30* (2023.02); *H10B 12/34* (2023.02); *H10B 51/20* (2023.02); *H10D 64/512* (2025.01)

(58) Field of Classification Search
CPC ........ H10B 12/20; H10B 12/30; H10B 12/34; H10B 51/20; H10B 51/30; H10D 64/512
See application file for complete search history.

(56) References Cited

U.S. PATENT DOCUMENTS

| | | | | |
|---|---|---|---|---|
| 11,997,855 B2 * | 5/2024 | Young | .................. | H10B 63/34 |
| 12,327,809 B2 * | 6/2025 | Sharma | .................. | H01L 24/83 |
| 2022/0199625 A1 * | 6/2022 | Lee | ........... | H10B 12/34 |
| 2023/0008261 A1 * | 1/2023 | Sharma | ............... | H10D 30/701 |
| 2023/0101700 A1 * | 3/2023 | Lee | ............ | H10B 12/01 |
| | | | | 257/443 |
| 2024/0015981 A1 * | 1/2024 | Lee | ..................... | H10D 30/701 |

FOREIGN PATENT DOCUMENTS

| | | | | |
|---|---|---|---|---|
| CN | 110828461 A | * | 2/2020 | ......... H01L 23/5329 |
| CN | 112437959 A | * | 3/2021 | ............ G11C 11/223 |

* cited by examiner

*Primary Examiner* — Matthew E Warren
(74) *Attorney, Agent, or Firm* — JCIPRNET

(57) ABSTRACT

A ferroelectric memory device and a memory array are provided. The ferroelectric memory device includes a word line; a pair of source/drain electrodes, a channel layer, a work function layer and a ferroelectric layer. The source/drain electrodes are disposed at opposite sides of the word line, and elevated from the word line. The channel layer has a bottom planar portion and wall portions. The bottom planar portion extends along a top surface of the word line, and opposite ends of the bottom planar portion are connected to sidewalls of the source/drain electrodes through opposite ones of the wall portions. The work function layer is electrically connected to the word line, and extends along the bottom planar portion and the wall portions of the channel layer. The ferroelectric layer separates the channel layer from the work function layer.

20 Claims, 25 Drawing Sheets

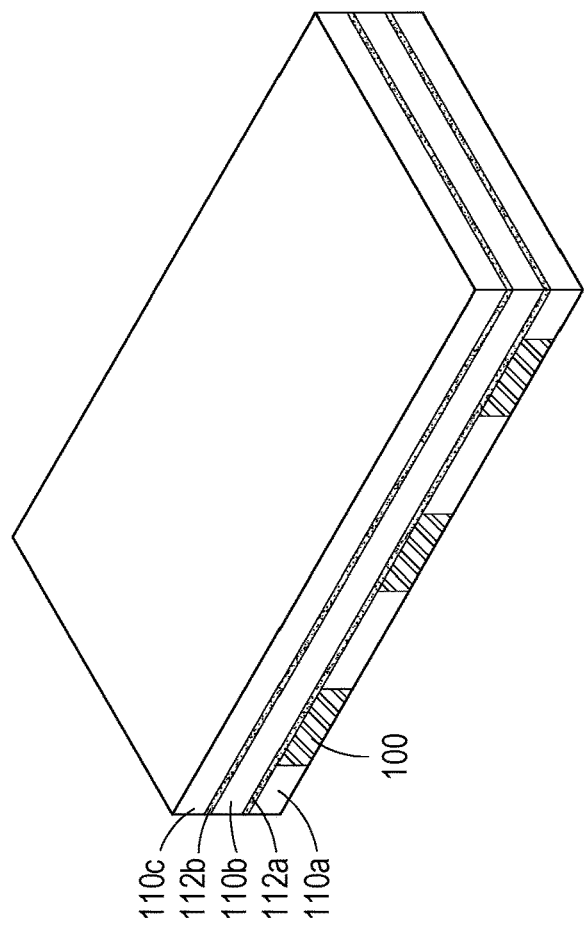
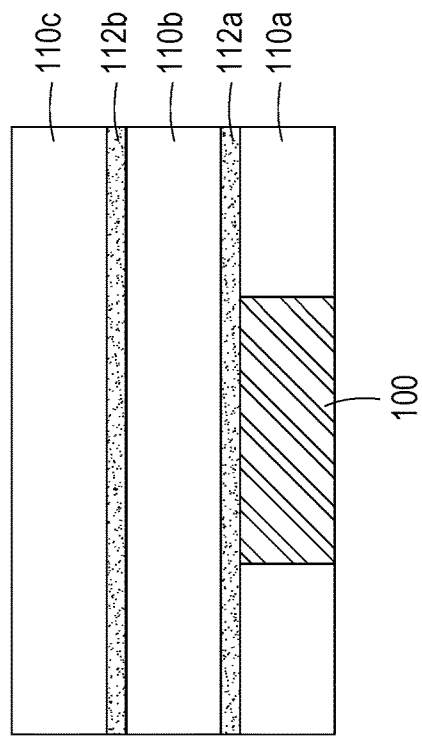
FIG. 4C
FIG. 4D

FERROELECTRIC MEMORY DEVICE AND MEMORY ARRAY

CROSS-REFERENCE TO RELATED APPLICATION

This application claims the priority benefit of U.S. provisional application Ser. No. 63/417,676, filed on Oct. 19, 2022. The entirety of the above-mentioned patent application is hereby incorporated by reference herein and made a part of this specification.

BACKGROUND

In recent development of nonvolatile memories, ferroelectric material is utilized as a storage medium. Information can be stored as a certain polarization state in the ferroelectric material, and such polarization state can be maintained even in absence of a voltage applied across the ferroelectric material. Due to non-volatility and superior data process speed, ferroelectric memory device has attracted considerable attention as a next generation memory device. However, while scaling down the ferroelectric memory device for increasing storage density, leakage current may be inevitably increased. As a consequence, higher power consumption for operating the ferroelectric memory device may be resulted.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A through FIG. 4L include schematic three-dimensional views each followed by a schematic cross-sectional view. The schematic three-dimensional views illustrate intermediate structures at a series of process steps as shown in FIG. 3, and the schematic cross-sectional views each illustrate a cell region of the intermediate structure of the preceding schematic three-dimensional view.

DETAILED DESCRIPTION

Figure 1:
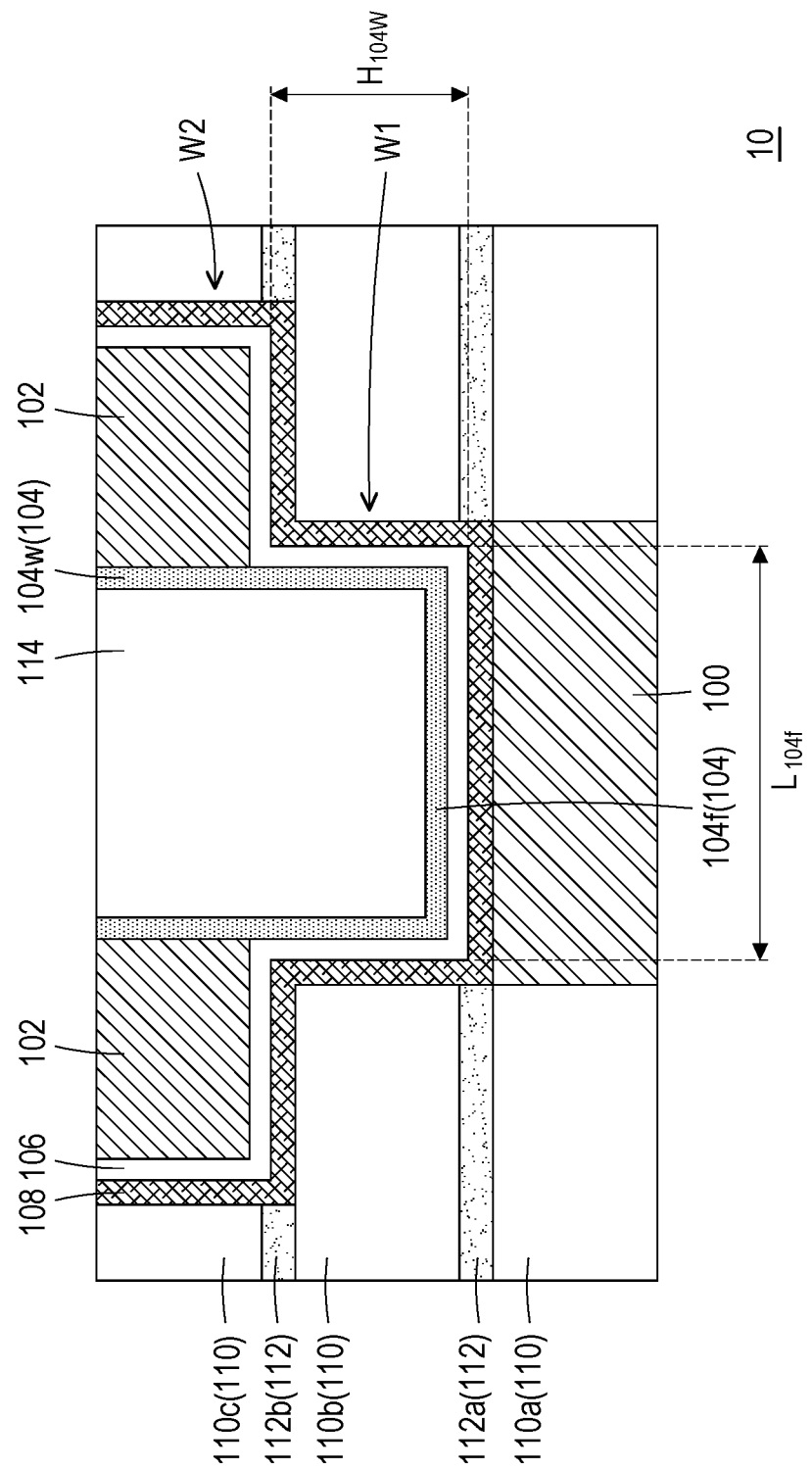
FIG. 1 is a schematic cross-sectional view illustrating a ferroelectric memory device, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional view illustrating a ferroelectric memory device 10, according to some embodiments of the present disclosure.

Referring to FIG. 1, the ferroelectric memory device 10 is a ferroelectric field effect transistor (FET). A word line 100 is provided as a gate terminal of the ferroelectric memory device 10, and a pair of source/drain electrodes 102 are provided as source and drain terminals of the ferroelectric memory device 10. Interchangeably, while one of the source/drain electrodes 102 is function as the source terminal, the other of the source/drain electrodes 102 is functioned as the drain terminal. As a switching layer, a channel layer 104 overlaps the word line 100, and switchably connects one of the source/drain electrodes 102 to the other. In addition, as a data storage layer, a ferroelectric layer 106 lies in between the word line 100 and the channel layer 104, such that the word line 100 can be capacitively coupled to the channel layer 104 through the ferroelectric layer 106. Furthermore, a work function layer 108 extending along the ferroelectric layer 106 and separating the word line 100 from the ferroelectric layer 106 is provided for tuning a threshold voltage of the ferroelectric memory device 10.

The word line 100 and the source/drain electrodes 102 are each formed of a conductive material. As examples, the word line 100 may be formed of TaN, TiN, W, Cu, Al, TiAl, polysilicon or the like, and the source/drain electrodes 102 may be formed of TaN, TiN, W, Al, polysilicon, Ru, Co, Cu, Mo, Nb or the like. On the other hand, the channel layer 104 is formed of a semiconductor material, which can be an N-type semiconductor material or a P-type semiconductor material. For instance, the N-type semiconductor material may include indium gallium zinc oxide (IGZO), zinc oxide, indium oxide, tin oxide, amorphous silicon, low-temperature polysilicon or the like, while the P-type semiconductor material may include nickel oxide, copper oxide, copper-aluminum oxide ($CuAlO_2$), copper-gallium oxide ($CuGaO_2$), copper-indium oxide ($CuInO_2$), strontium-copper oxide ($SrCu_2O_2$), tin oxide or the like. Further, the ferroelectric layer 106 is formed of a ferroelectric material, such as aluminum scandium nitride (AlScN), orthorhombic hafnium oxide, orthorhombic hafnium zirconium oxide (HZO), perovskite lead titanate, perovskite barium titanate perovskite lead zirconate, potassium phosphate, strontium bismuth tantalate (SBT) or the like. A conductive material for forming the work function layer 108 is selected according to device characteristics and material selection of the channel layer 104 and the ferroelectric layer 106. As examples, the conductive material for forming the work function layer 108 may include Ru, WCN, Ti, TiN, W, Mo, Pt, the like or combinations thereof.

According to some embodiments, among other conductive features, the ferroelectric memory device 10 is embedded in a back-end-of-line (BEOL) structure of a semiconductor chip. The BEOL structure may include dielectric layers 110 stacked over a semiconductor substrate of the semiconductor chip, and may include etching stop layers 112 inserted between the dielectric layers 110. The dielectric layers 110 may include dielectric layers 110a, 110b, 110c stacked in order along a height direction, and the etching stop layers 112 may include an etching stop layer 112a between the dielectric layers 110a, 110b, as well as an etching stop layer 112b between the dielectric layers 110b, 110c.

The word line 100 is formed in the dielectric layer 110a, and other elements of the ferroelectric memory device 10 are formed in openings W1, W2 extending to the word line 100 through the dielectric layers 110b, 110c and the etching stop layers 112a, 112b. The opening W2 extending through the dielectric layer 110c and the etching stop layer 112b is greater in size as compared to the opening W1 extending through the dielectric layer 110b and the etching stop layer 112a. In addition, a central part of the opening W2 overlaps the opening W1, while rest parts of the opening W2 are located at opposite sides of the opening W1. As a result of such arrangement, steps are defined by sidewalls of the dielectric layer 110b along opposite sides of the opening W1 as well as separated portions of a top surface of the dielectric layer 110b overlapped with the opening W2.

The ferroelectric layer 106 and the work function layer 108 may conformally cover sidewalls of the dielectric layer 110c enclosing the opening W2, the portions of the top surface of the dielectric layer 110b overlapped with the opening W2, sidewalls of the dielectric layer 110b enclosing the opening W1 and the top surface of the word line 100. As the work function layer 108 is covered by the ferroelectric layer 106, the ferroelectric layer is in contact with the word line 100, the dielectric layers 110b, 110c and the etching stop layers 112a, 112b through the work function layer 108.

The source/drain electrodes 102 are disposed on the steps defined in the opening W1, W2, and are elevated from the word line 100. In some embodiments, portions of the ferroelectric layer 106 and the work function layer 108 extend along bottom surfaces and sidewalls of the source/drain electrodes 102, and separate the source/drain electrodes 102 from the dielectric layers 110b, 110c and the etching stop layer 112b. Further, in some embodiments, a sidewall of each source/drain electrode 102 is substantially aligned with a surface of a wall portion of the ferroelectric layer 106 extending along one of the opposite sidewalls of the dielectric layer 110b. As will be described, in alternative embodiments, the sidewall of each source/drain electrode 102 is laterally recessed from the surface of the wall portion of the ferroelectric layer 106 extending along one of the opposite sidewalls of the dielectric layer 110b.

The channel layer 104 may have a bottom planar portion 104f extending along the top surface of the word line 100, and have wall portions 104w standing on edges of the bottom planar portion 104f and in lateral contact with the wall portions of the ferroelectric layer 106 extending along the sidewalls of the dielectric layer 110b. The source/drain electrodes 102 can be connected via a conduction channel passing through opposite ones of the wall portions 104w and the bottom planar portion 104f The word line 100 and a portion of the work function layer 108 extending along are capacitively coupled to the bottom planar portion 104f of the channel layer 104. As electrically connected to the word line 100, wall portions of the work function layer 108 extending along the sidewalls of the dielectric layer 110b may be functioned as an extending portion of the word line 100, and the wall portions 104w of the channel layer 104 along which the conduction channel passes through can be capacitively coupled to the wall portions of the work function layer 108. Therefore, a channel length of the ferroelectric memory device 10 can be defined as a sum of a length $L_{104f}$ of the bottom planar portion 104f of the channel layer 104 measured between the opposite sidewalls of the dielectric layer 110b; and two times of a height $H_{104w}$ by which the wall portions 104w of the channel layer 104 are capacitively coupled to the work function layer 108. As compared to a ferroelectric FET with a conduction channel merely extending along a lateral direction, the ferroelectric memory device 10 has a longer channel as a result of the three-dimensional channel layer 104 and the work function layer 108 as an extension of gate control (i.e., control of the word line 100 over charge carriers in the channel layer 104), thus may be operated with a lower off-current and fewer power consumption. Furthermore, the channel length of the ferroelectric memory device 10 is adjustable without changing the length $L_{104f}$ since the height $H_{104w}$ can be adjusted by altering a thickness of the dielectric layer 110b.

In some embodiments, a recess defined by the bottom planar portion 104f and the wall portions 104w of the channel layer 104 is filled by a dielectric material 114. As an example, the dielectric material 114 may be formed to a height substantially leveled with the top ends of the wall portions 104w of the channel layer 104 as well as the top surfaces of the source/drain electrodes 102.

In terms of operation, the ferroelectric memory device 10 is similar to a FET. Whether a conduction channel electrically connecting one of the source/drain electrodes 102 to the other could be established along the channel layer 104 is controlled by a switching voltage applied across the channel layer 104 and the ferroelectric layer 106. When the switching voltage reaches a threshold value (also referred to as a threshold voltage of the ferroelectric memory device 10), the conduction channel can be established. On the other hand, when the switching voltage does not reach the threshold value or falls below the threshold value, the conduction channel should be absent or cut off.

As a difference from a FET, the threshold voltage of the ferroelectric memory device 10 is alterable, and is dependent on a polarization state of the ferroelectric layer 106. If an electric field created across the ferroelectric layer 106 as a result of a first polarization state of the ferroelectric layer 106 is in a direction aligned with a polarity of the switching voltage, a smaller threshold voltage may be obtained. In contrast, if an electric field across the ferroelectric layer 106 induced by a second polarization state of the ferroelectric layer 106 is in a direction opposite to the polarity of the switching voltage, then a higher threshold voltage may be resulted. During a write operation of the ferroelectric memory device 10, the ferroelectric layer 106 can be written with either the first polarization state resulting the smaller threshold voltage or the second polarization state resulting the greater threshold voltage. During a read operation, the switching voltage is provided with an amplitude greater than the rather small threshold voltage and less than the rather large threshold voltage. If the ferroelectric layer 106 is written with the first polarization state (which results in a rather small threshold voltage), then a current path can be established through the channel layer 104 by this switching voltage. On the other hand, if the ferroelectric layer 106 is written with the second polarization state (which results in a rather large threshold voltage), then a current path may not be established through the channel layer 104 by this switching voltage. By sensing a resistivity of the channel layer 104 in response to this switching voltage, whether a current can be established through the channel layer 104 can be identified. Therefore, whether the ferroelectric layer 106 is in the first polarization state or the second polarization state can be recognized. Accordingly, binary data can be stored in the ferroelectric memory device 10 as the first polarization state or the second polarization state of the ferroelectric layer 106.

As described above, the conduction channel of the ferroelectric memory device 10 may have a total length as a sum of the length $L_{104f}$ and two times of the height $H_{104w}$, and the height $H_{104w}$ can be adjusted by altering the thickness of the dielectric layer 110b. While having a longer conduction channel (as compared to a ferroelectric FET with a channel length equal to the length $L_{104f}$), the ferroelectric memory device 10 can be operated with lower off-current and fewer power consumption. Alternatively, when the ferroelectric memory device 10 is further scaled that the length $L_{104f}$ is shortened, the conduction channel may still have a total length long enough for ensuring acceptable off-current and power consumption.

Figure 2A:
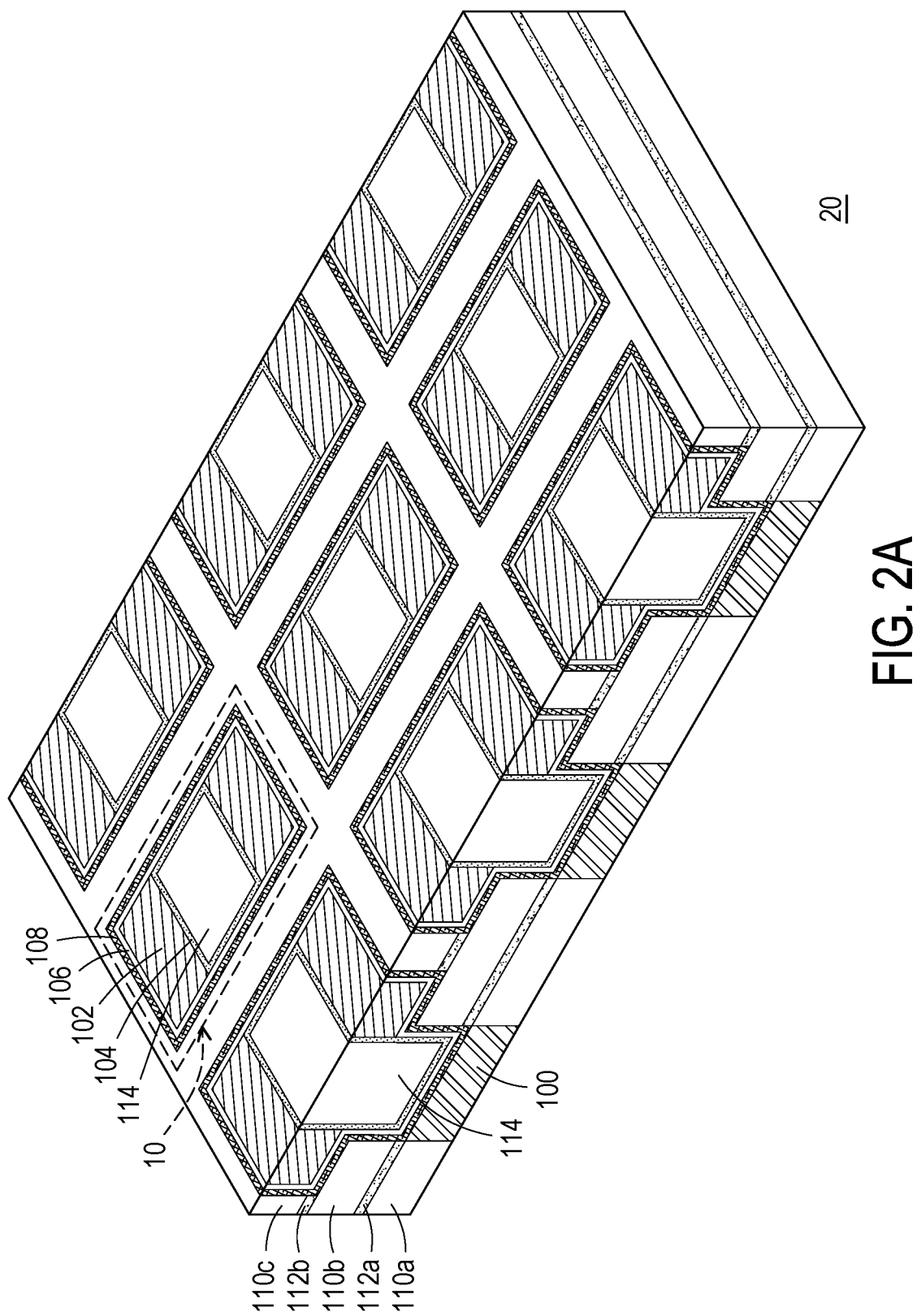
FIG. 2A is a schematic three-dimensional view illustrating a memory array including a plurality of the ferroelectric memory devices, according to some embodiments of the present disclosure.
Figure 2B:
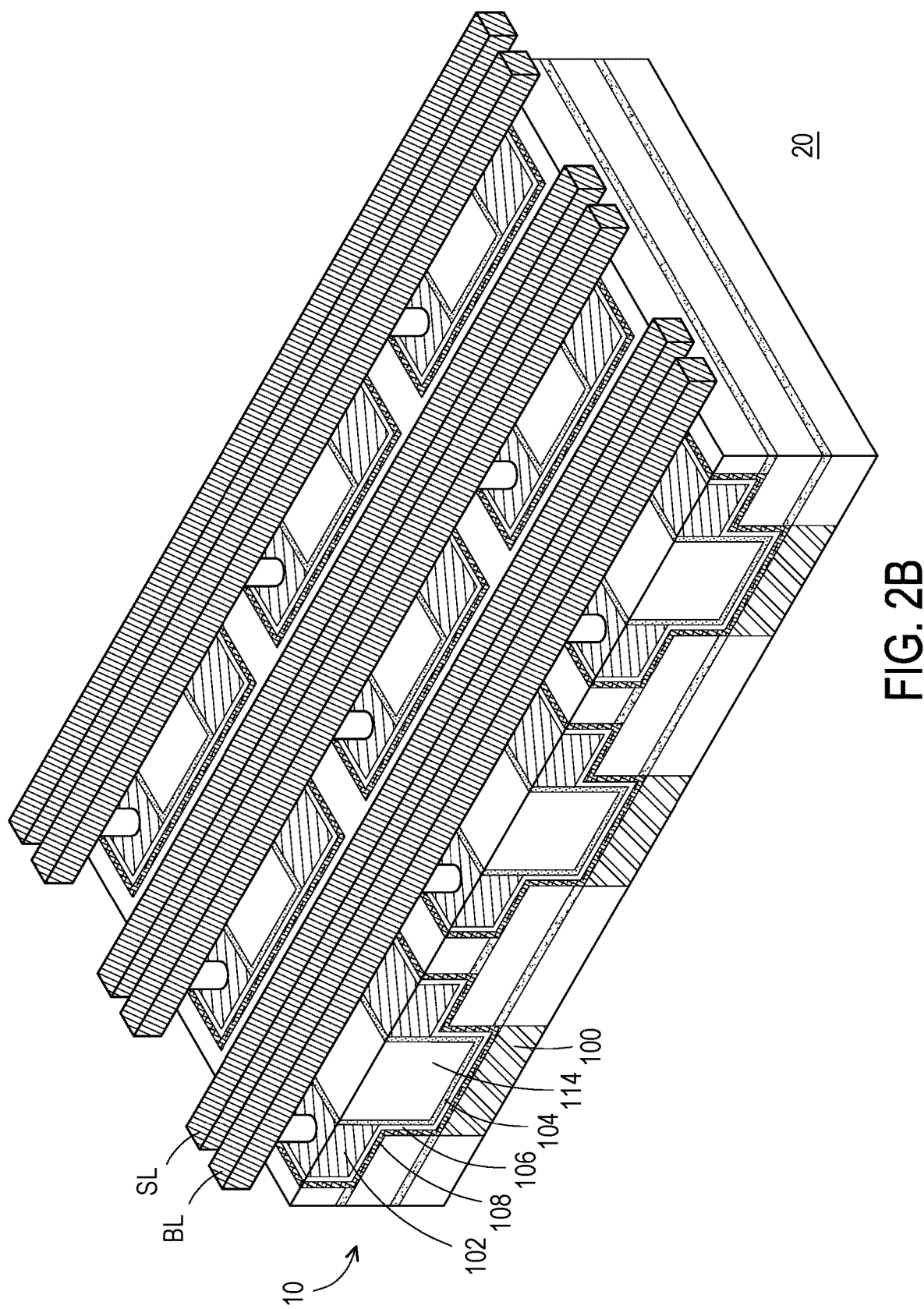
FIG. 2B is a schematic three-dimensional view showing bit lines and source lines connecting to the ferroelectric memory devices in the memory array, according to some embodiments of the present disclosure.

FIG. 2A is a schematic three-dimensional view illustrating a memory array 20 including a plurality of the ferroelectric memory devices 10, according to some embodiments of the present disclosure. FIG. 2B is a schematic three-dimensional view showing bit lines BL and source lines SL connecting to the ferroelectric memory devices 10 in the memory array 20, according to some embodiments of the present disclosure.

Referring to FIG. 2A, an array of the ferroelectric memory devices 10 are formed in a stacking structure including the dielectric layers 110a, 110b, 110c and the etching stop layers 112a, 112b between the dielectric layers 110a, 110b, 110c. A plurality of the word lines 100 may extend along a column direction, and may be respectively shared by a column of the ferroelectric memory devices 10. As shown in FIG. 2B, pairs of source lines SL and bit lines BL may extend along a row direction, and are electrically connected to the source/drain electrodes 102 of the ferroelectric memory devices 10. One of the source/drain electrodes 102 in each ferroelectric memory device is electrically connected to one of the source lines SL, while the other source/drain electrode 102 in each ferroelectric memory device 10 is electrically connected to one of the bit lines BL. In addition, the source line SL and the bit line BL in each pair may be shared by a row of the ferroelectric memory devices 10.

As further shown in FIG. 2A, in each ferroelectric memory device 10, the source/drain electrodes 102, the channel layer 104 and the dielectric material 114 are laterally enclosed by the ferroelectric layer 106 and the work function layer 108, and the dielectric material 114 is wrapped around by the channel layer 104. Further, in each ferroelectric memory device 10, the source/drain electrodes 102 are laterally separated from each other via the channel layer 104 and the dielectric material 114, and may extend along the column direction.

Figure 3:
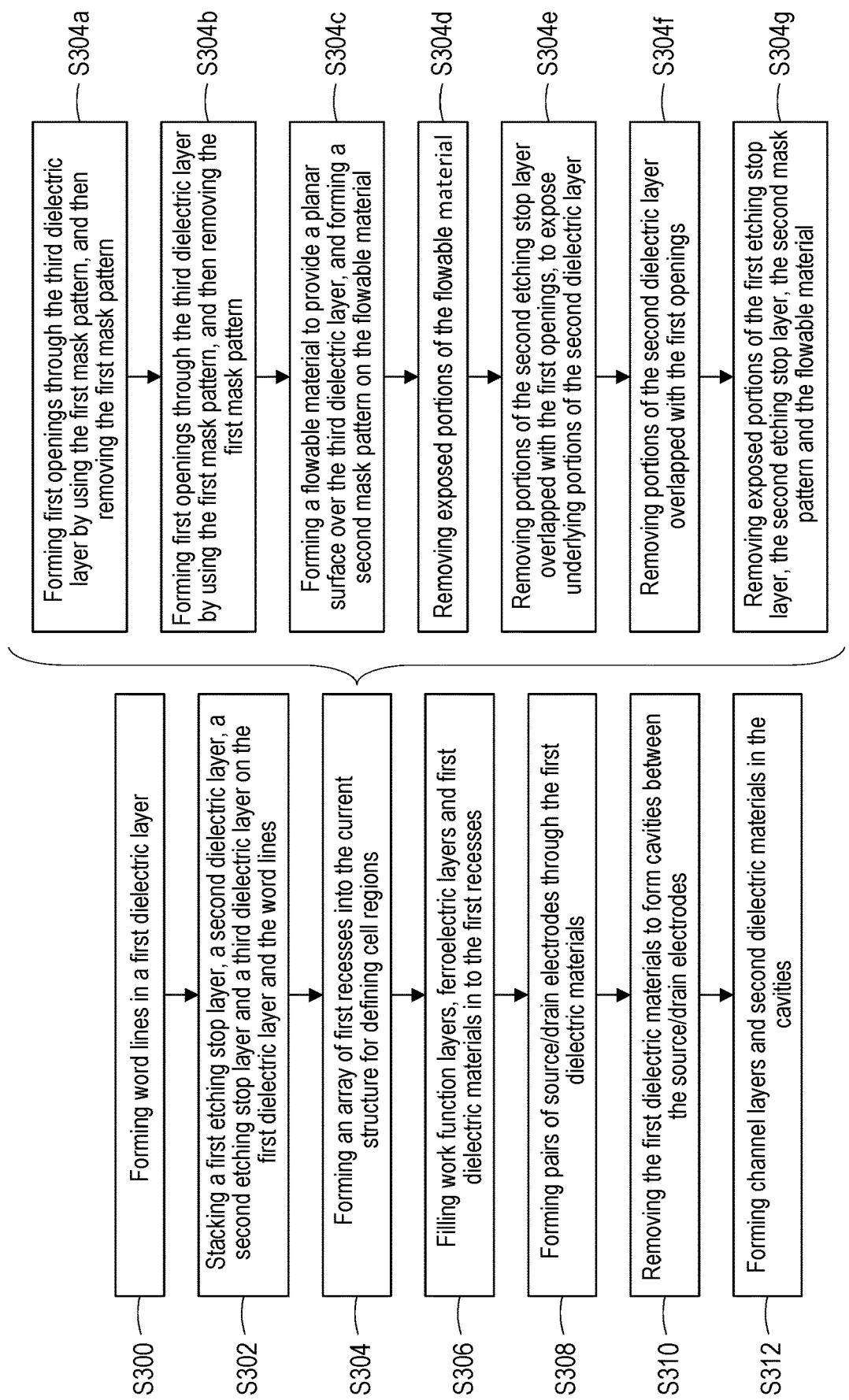
FIG. 3 is a flow diagram illustrating a process for forming the memory array, according to some embodiments of the present disclosure.

FIG. 3 is a flow diagram illustrating a process for forming the memory array 20, according to some embodiments of the present disclosure. FIG. 4A through FIG. 4L include schematic three-dimensional views each followed by a schematic cross-sectional view. The schematic three-dimensional views illustrate intermediate structures at a series of process steps as shown in FIG. 3, and the schematic cross-sectional views each illustrate a cell region of the intermediate structure of the preceding schematic three-dimensional view.

Figure 4B:
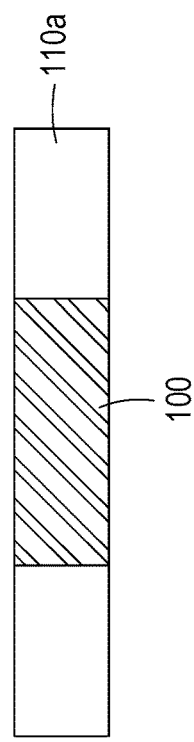
Figure 4A:
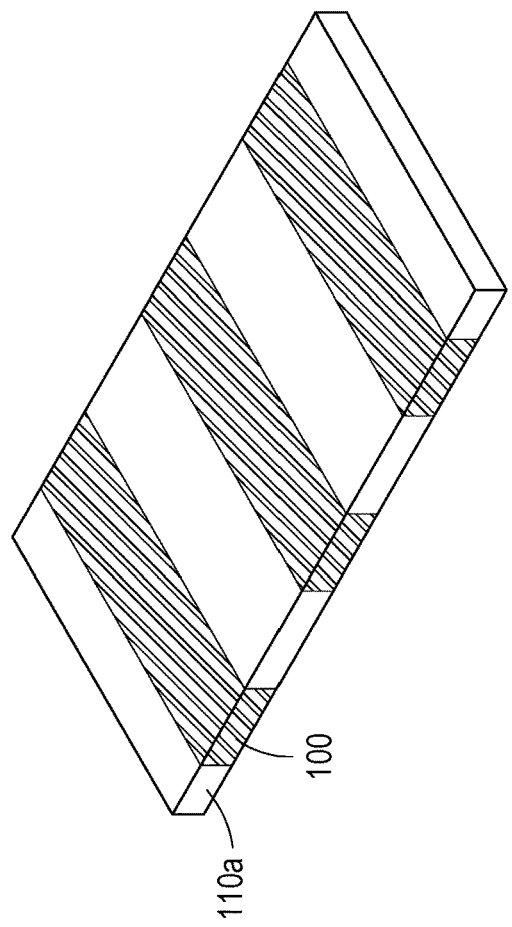

Referring to FIG. 3, FIG. 4A and FIG. 4B, at a step S300, a plurality of the word lines 100 are formed in the dielectric layer 110a. As described above, the dielectric layer 110a may be provided over a semiconductor substrate. A method for forming the word lines 100 in the dielectric layer 110a may include forming trenches in the dielectric layer 110a, and filling a conductive material in the trenches. After performing a possible planarization process for removing portions of the conductive material over the dielectric layer 110a, remained portions of the conductive material in the trenches may form the word lines 100.

Referring to FIG. 3, FIG. 4C and FIG. 4D, at a step S302, the etching stop layer 112a, the dielectric layer 110b, the etching stop layer 112b and the dielectric layer 110c are stacked on the dielectric layer 110a and the word lines 100 by order. Currently, the word lines 100 are covered by the dielectric layers 110b, 110c and the etching stop layers 112a, 112b.

Figure 4F:
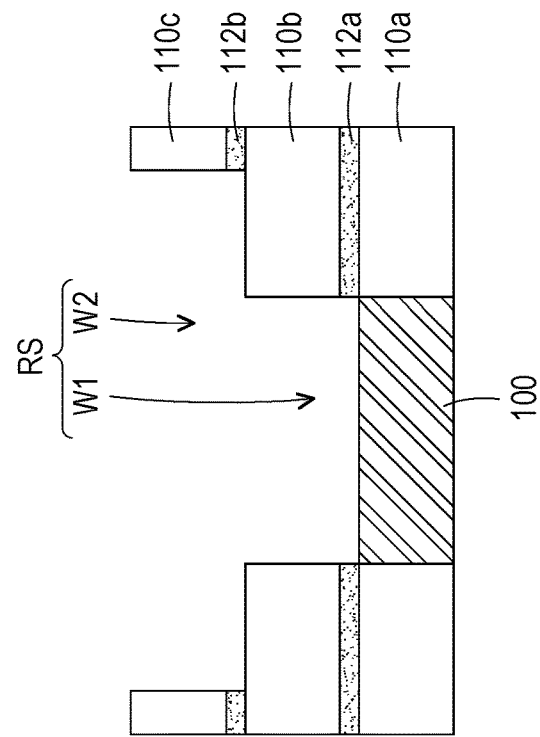
Figure 4E:
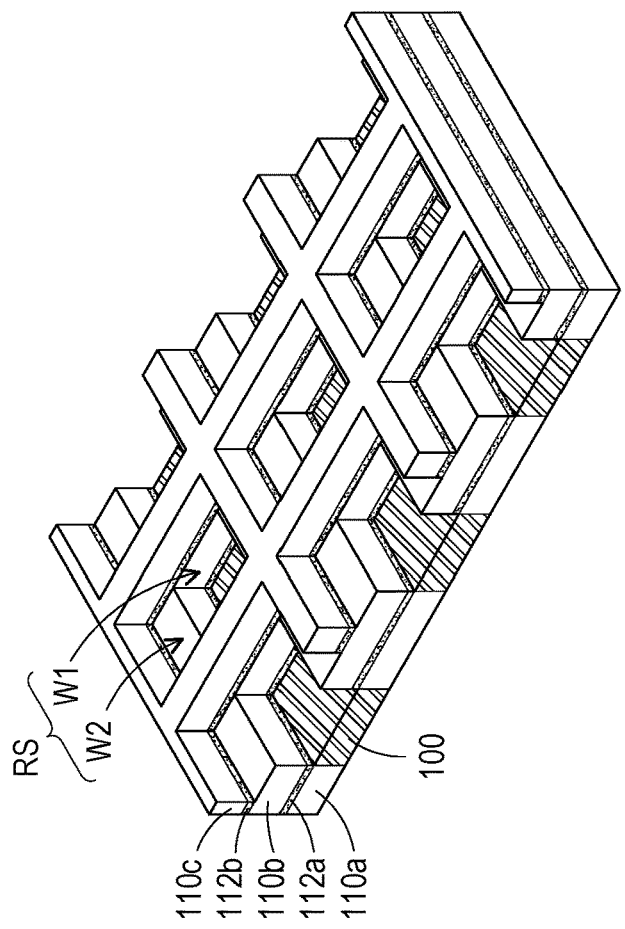

Referring to FIG. 3, FIG. 4E and FIG. 4F, at a step S304, an array of recesses RS are formed into the current structure for defining cell regions. The recesses RS extend to the word lines 100 from a topmost surface of the dielectric layer 110c, such that portions of the word lines 100 are exposed in the current step. A plurality of the openings W1 and a plurality of the openings W2 each overlapping one of the openings W1 are formed for defining the recesses RS. According to some embodiments, the step S304 for forming the recesses RS include multiple sub-steps.

FIG. 5A through FIG. 5F are schematic cross-sectional views illustrating intermediate structures at a series of sub-steps for forming one of the recesses RS, according to some embodiments of the present disclosure.

Figure 5A:
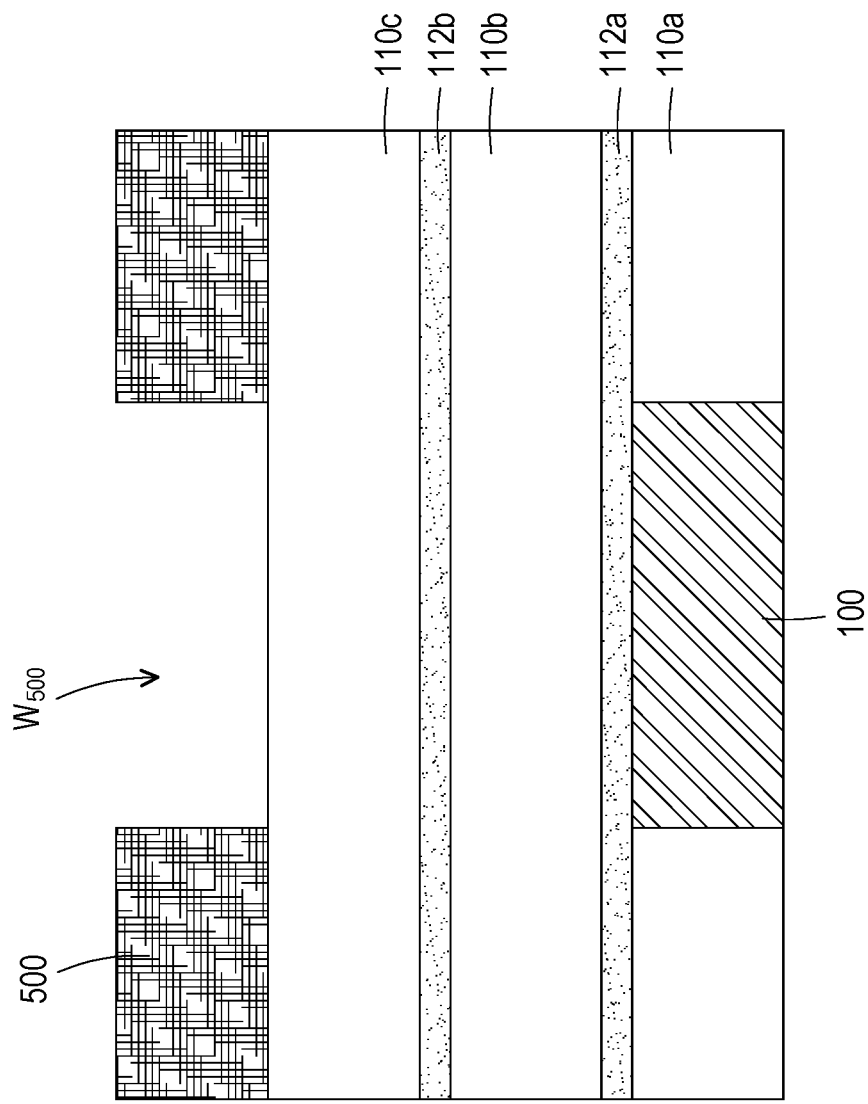
FIG. 5A through FIG. 5F are schematic cross-sectional views illustrating intermediate structures at a series of sub-steps for forming a cell region of the memory array, according to some embodiments of the present disclosure.

Referring to FIG. 3 and FIG. 5A, a sub-step S304a is performed, and a mask pattern 500 is formed on the dielectric layer 110c. The mask pattern 500 has openings $W_{500}$ (only a single one is shown) respectively overlapping a portion of one of the word lines 100. As the openings $W_{500}$ in the mask pattern 500 will be eventually transferred to the dielectric layer 110b and the etching stop layer 112a to form the openings W1, each of the openings $W_{500}$ may have a width substantially identical with a width of each of the openings W1. In some embodiments, the mask pattern 500 is a photoresist pattern, and a method for forming the mask pattern 500 may include a coating process and a following lithography process.

Figure 5B:
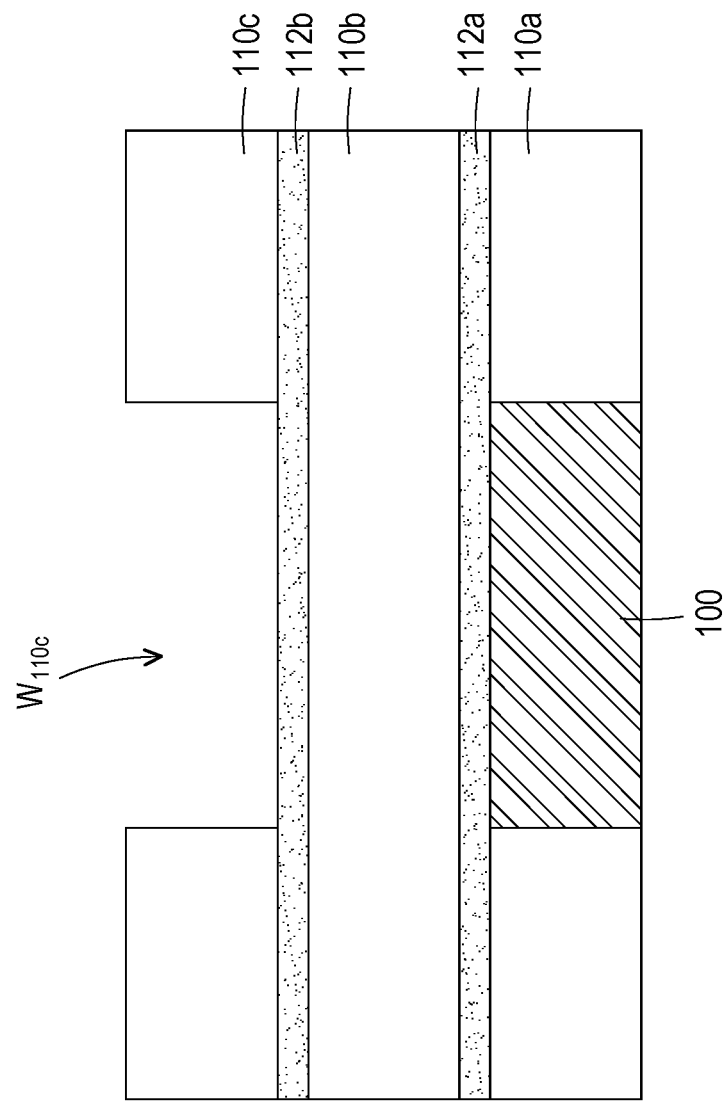

Referring to FIG. 3 and FIG. 5B, a sub-step S304b is performed, and openings $W_{110c}$ (only a single one is shown) are formed through the dielectric layer 110c by using the mask pattern 500. That is, the openings $W_{500}$ in the mask pattern 500 are currently transferred to the dielectric layer 110c, and formation of the openings $W_{110c}$ is resulted. In following steps, the openings $W_{110c}$ in the dielectric layer 110c will be further transferred to the dielectric layer 110b and the etching stop layer 112a for forming the openings W1, thus a width of each of the openings W Hoc may be substantially identical with the width of each of the eventually formed openings W1. An etching process for forming the openings Wick may be performed till the etching stop layer 112b is exposed, such that the openings $W_{110c}$ are bounded at a top surface of the etching stop layer 112b. Further, as the openings $W_{110c}$ are formed, the mask pattern 500 may be removed.

Figure 5C:
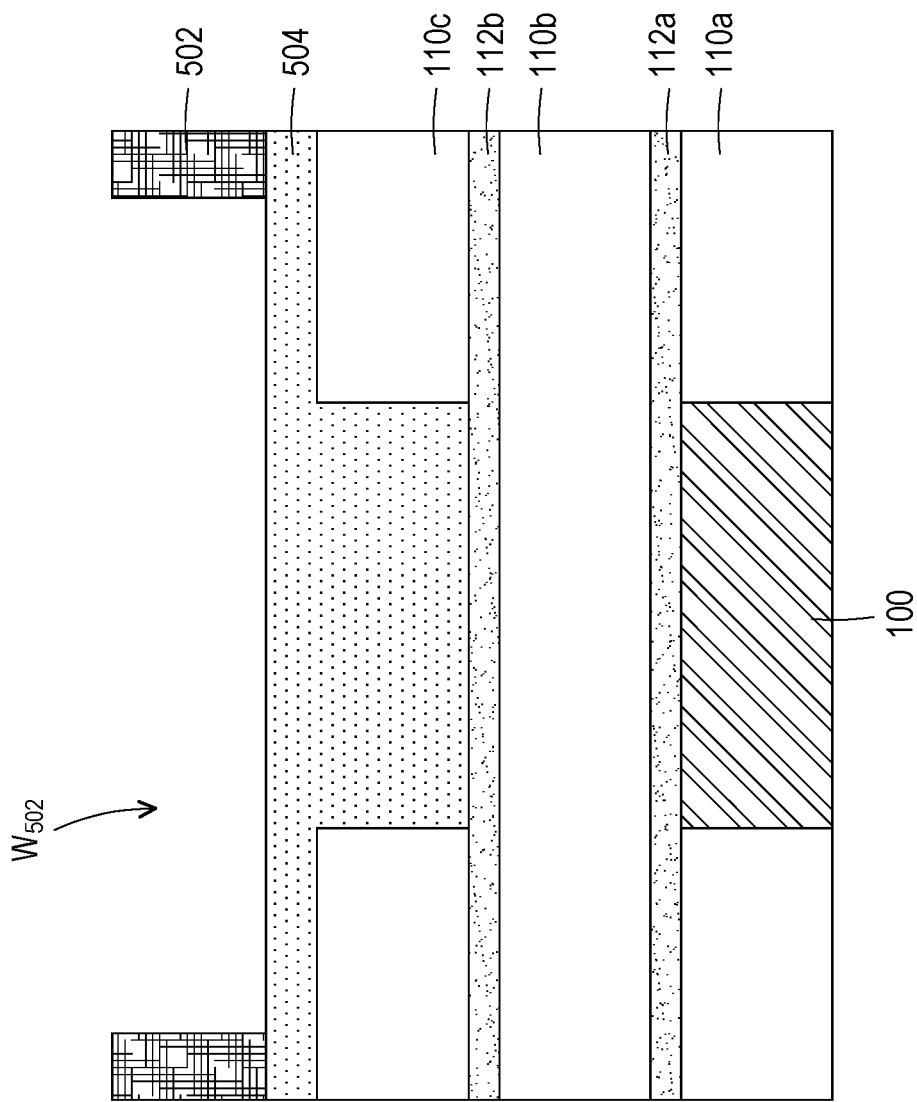

Referring to FIG. 3 and FIG. 5C, a sub-step S304c is performed, and another mask pattern 502 is formed on the dielectric layer 110c. The mask pattern 502 has openings $W_{502}$ (only a single one is shown) to be transferred to the dielectric layer 110c and the etching stop layer 112b. As a result of such transfer, the opening $W_{110c}$ in the dielectric layer 110c will expand to form the openings W2. Therefore, the openings $W_{502}$ may each have a width substantially identical with a width of each of the openings W2. In some embodiments, the mask pattern 502 is a photoresist pattern, and a method for forming the mask pattern 502 may include a coating process and a following lithography process. Further, the openings 110c in the dielectric layer 110c may be filled up by a flowable material 504 before formation of the mask pattern 502. The flowable material 504 may further extend onto the top surface of the dielectric layer 110c, such that the mask pattern 502 is subsequently formed on a planar surface provided by the flowable material 504.

Figure 5D:
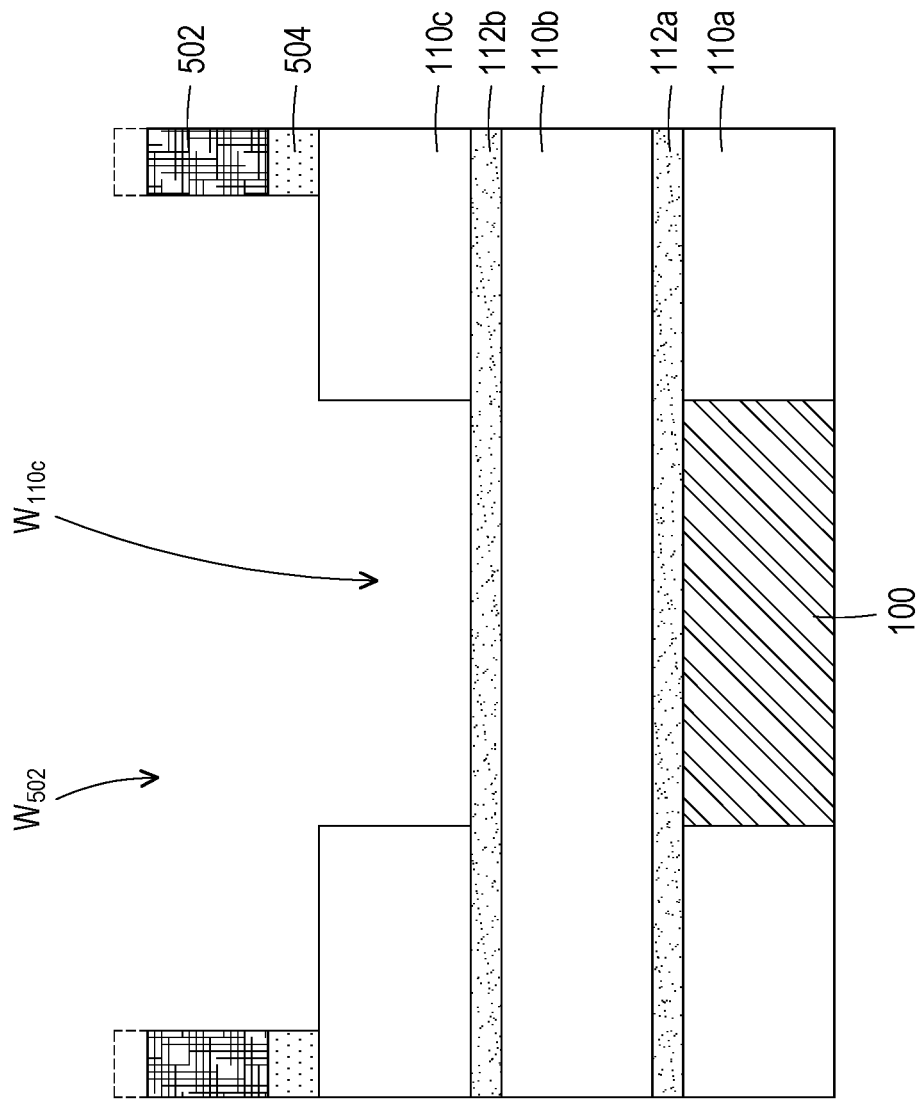

Referring to FIG. 3 and FIG. 5D, a sub-step S304d is performed, and exposed portions of the flowable material 504 are removed. That is, portions of the flowable material 504 not covered by the mask pattern 502 are removed, while portions of the flowable material 504 lying below the mask pattern 502 remain. As a result of removing the exposed portions of the flowable material 504, the openings $W_{110c}$ are emptied, and the portions of the etching stop layer 112b overlapped with the openings $W_{110c}$ are currently exposed. Further, during the removal, portions of the dielectric layer 110c not shielded by the mask pattern 502 may be recessed with respect to portions of the dielectric layer 110c covered by the mask pattern 502. In addition, the mask pattern 502 may be partially consumed during the removal.

Figure 5E:
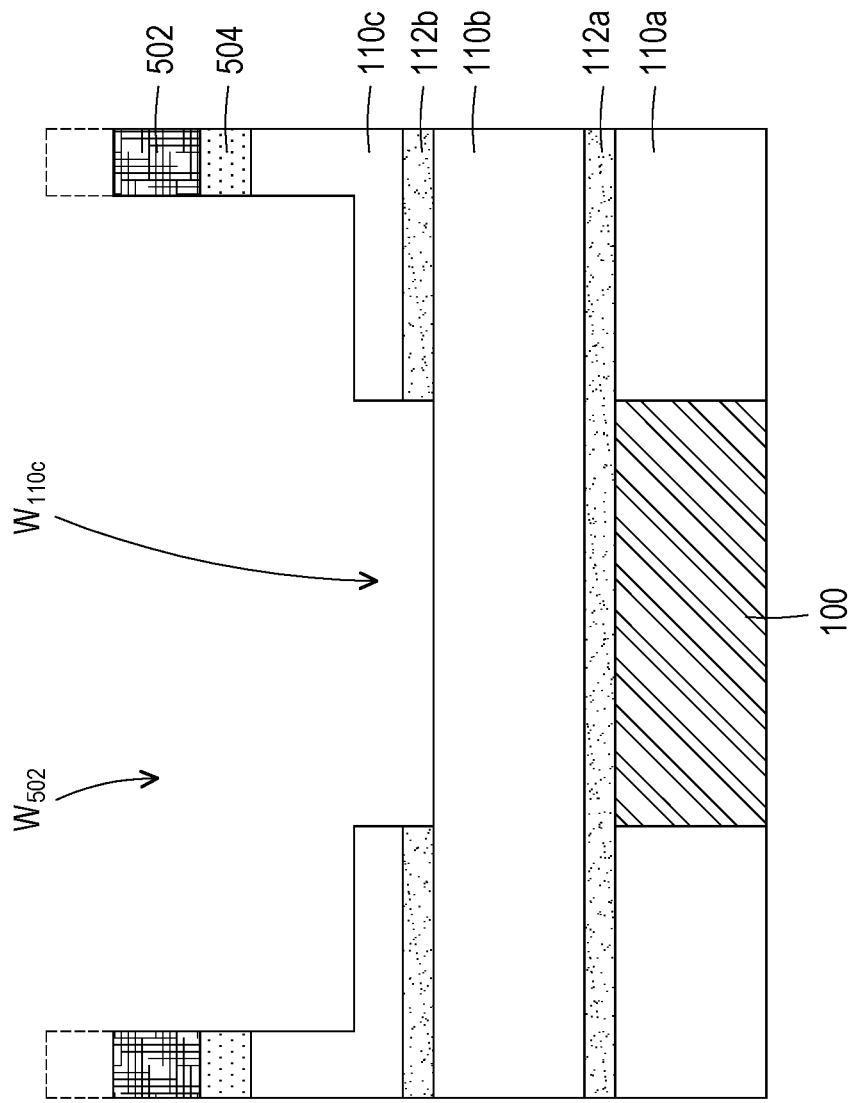

Referring to FIG. 3 and FIG. 5E, a sub-step S304e is performed, and the portions of the etching stop layer 112b overlapped with the openings $W_{110c}$ are removed, and underlying portions of the dielectric layer 110b are exposed. That is, the openings $W_{110c}$ further extend through the etching stop layer 112b, to a top surface of the dielectric layer 110b. Meanwhile, the portions of the dielectric layer 110c not covered by the mask pattern 502 and the flowable material 504 may be further recessed with respect to the portions of the dielectric layer 110c shielded by the mask pattern 502 and the flowable material 504. In addition, the mask pattern 502 may be further thinned during the removal.

Figure 5F:
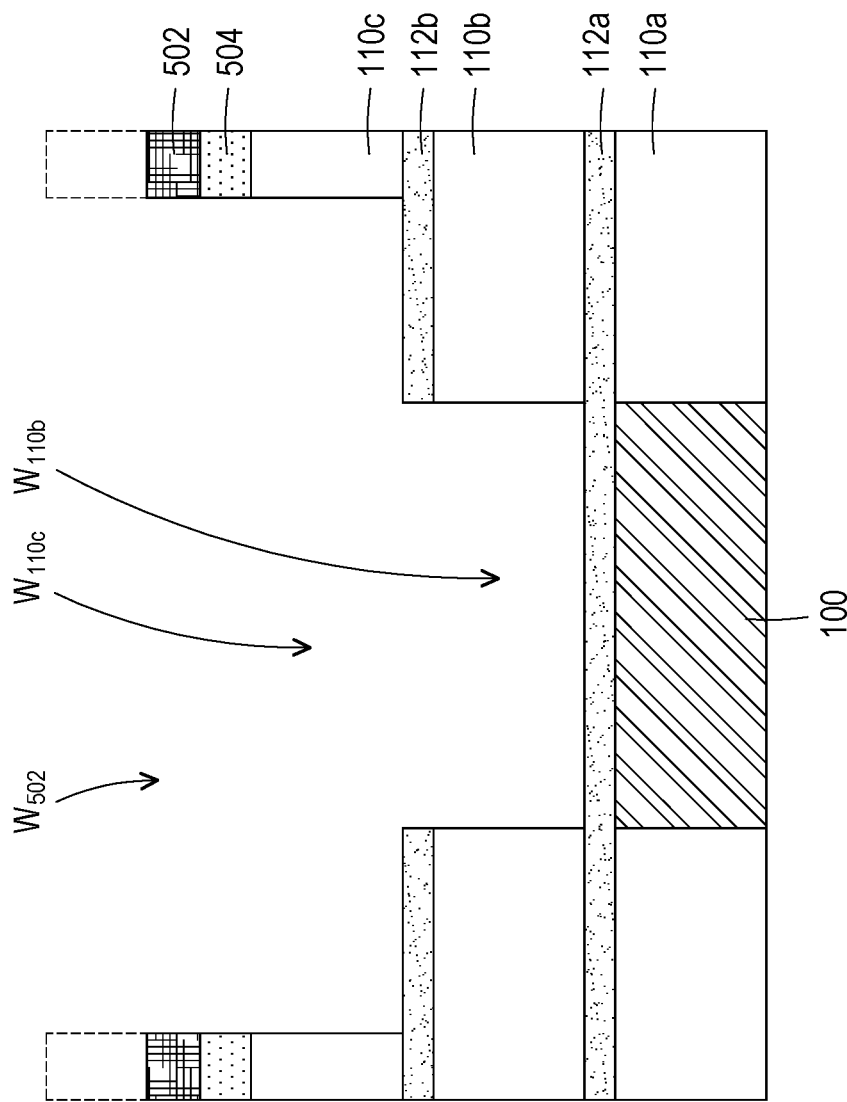

Referring to FIG. 3 and FIG. 5F, a sub-step S304f is performed, and the portions of the dielectric layer 110b overlapped with the openings $W_{110c}$ are removed. As a result, the openings $W_{110c}$, which are defined by the openings $W_{500}$ of the mask pattern 500 (as shown in FIG. 5A), are transferred to the dielectric layer 110b, and openings $W_{110b}$ (only a single one is shown) are formed in the dielectric layer 110b. Due to etching selectivity, the openings $W_{110b}$ may not extend through the etching stop layer 112a. In other words, portions of the etching stop layer 112a lying under the openings $W_{110b}$ may be currently exposed. Further, while forming the openings $W_{110b}$, the portions of the dielectric layer 110c not shielded by the mask pattern 502 may be completely removed, such that the openings Wick are expanded to the size of the openings $W_{502}$ of the mask pattern 502, and the underlying portions of the etching stop layer 112b may be currently exposed. In addition, while forming the openings $W_{110b}$, the mask pattern 502 may be further thinned.

Subsequently, a sub-step S304g is performed, and exposed portions of the etching stop layers 112a, 112b, the mask pattern 502 and the flowable material 504 are removed. The resulting structure is shown in FIG. 4E and FIG. 4F. The openings $W_{110b}$ further extend through the etching stop layer 112a, to form the openings W1, and to expose portions of the word lines 100. In addition, the openings $W_{110c}$ further extend through the etching stop layer 112b, to form the openings W2. Each of the openings W1 and the overlying opening W2 collectively form one of the recesses RS extending to the word lines 100 from the top surface of the dielectric layer 110c, and the recesses RS define the cell regions of the memory array 20.

Figure 4H:
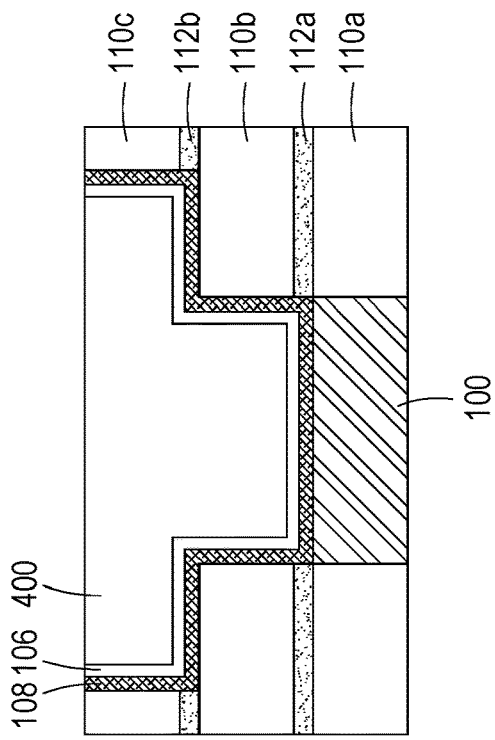
Figure 4G:
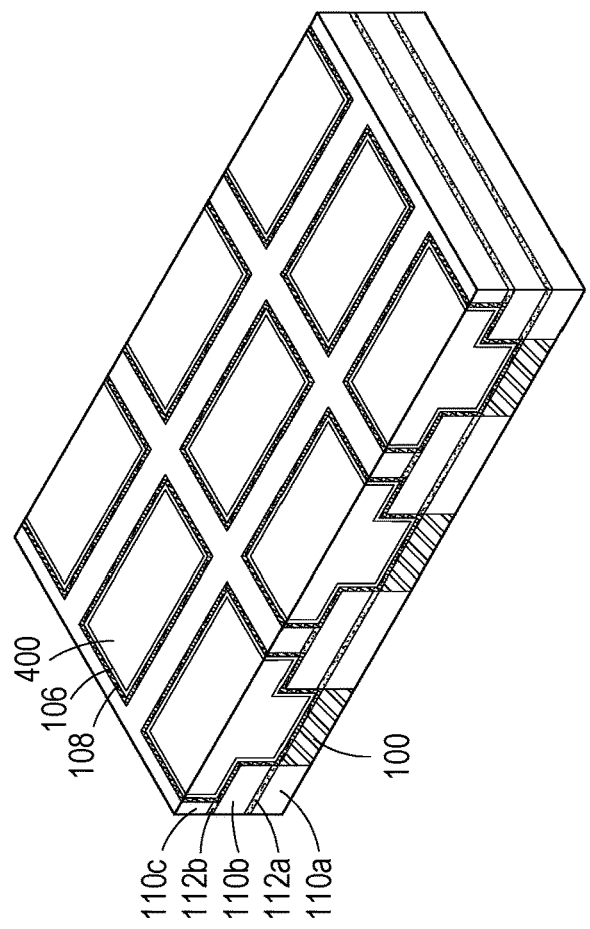

Referring to FIG. 3, FIG. 4G and FIG. 4H, at a step S306, the work function layers 308, the ferroelectric layers 306 and dielectric materials 400 are filled in the recesses RS. The work function layers 308 and the ferroelectric layers 306 may conformally cover entire surfaces of the recesses RS by order, and the dielectric materials 400 formed on the ferroelectric layers 306 may fill up the recesses RS. According to some embodiments, a method for forming the work function layers 308, the ferroelectric layers 306 and the dielectric materials 400 includes forming a work function material layer and a ferroelectric material layer conformally covering the entire structure as shown in FIG. 4E and FIG. 4F, and providing an initial dielectric material on the work function material layer and the ferroelectric material layer. A planarization process may be used for removing portions of the work function material layer, the ferroelectric material layer and the initial dielectric material over the top surface of the dielectric layer 110c. As a result, remained portions of the work function material layer may form the work function layers 108; remained portions of the ferroelectric material layer may form the ferroelectric layers 106; and remained portions of the initial dielectric material may form the dielectric materials 400.

Figure 4J:
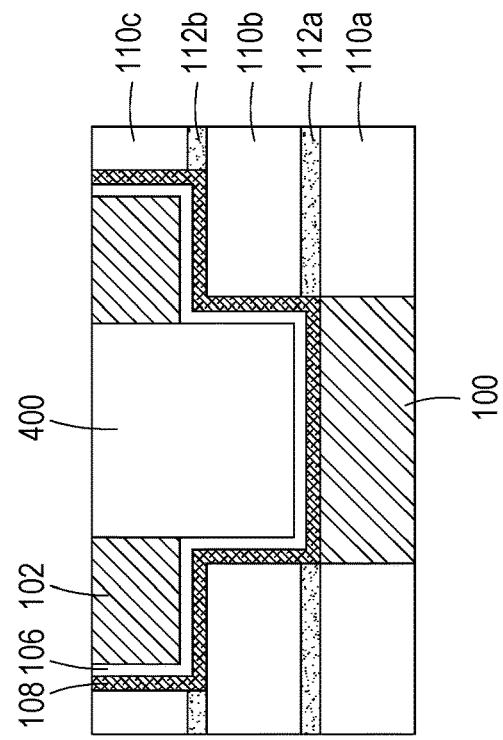
Figure 4I:
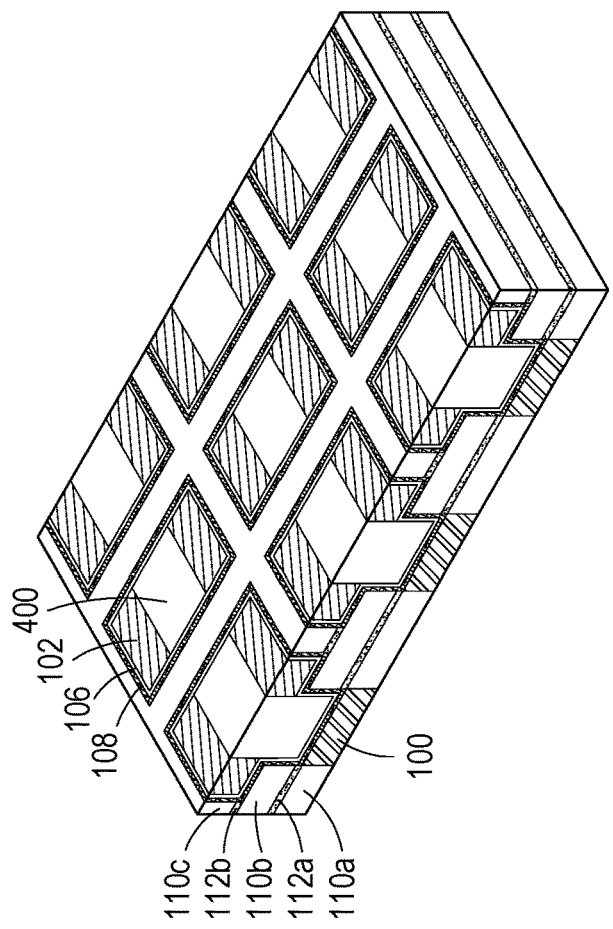

Referring to FIG. 3, FIG. 4I and FIG. 4J, at a step S308, pairs of the source/drain electrodes 102 are formed through the dielectric materials 400. Currently, the source/drain electrodes 102 in each pair are laterally separated from each other through the dielectric material 400 in between. As will be further described, the dielectric materials 400 will be replaced with the channel layers 104 and the dielectric materials 114. In the current step, a method for forming the source/drain electrodes 102 may include removing portions of the dielectric materials 400 to form openings extending through the dielectric materials 400, and filling a conductive material into these openings. A possible planarization process may be used for removing portions of the conductive material over the top surface of the dielectric layer 110c, and portions of the conductive material left in the openings form the source/drain electrodes 102.

Figure 4L:
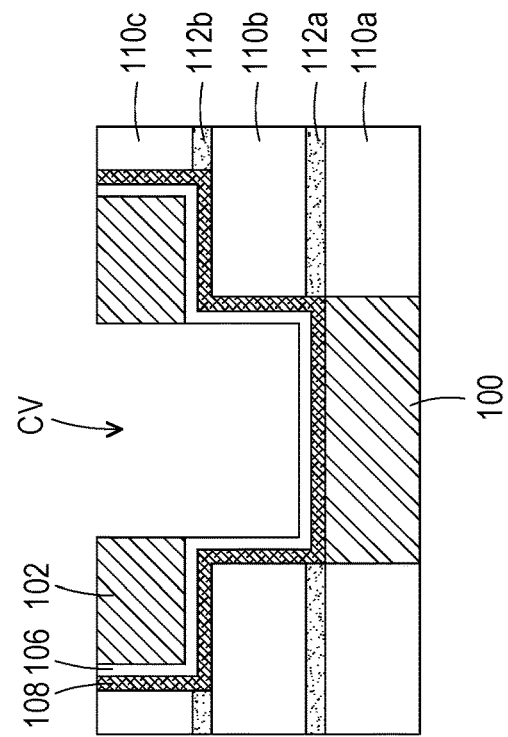
Figure 4K:
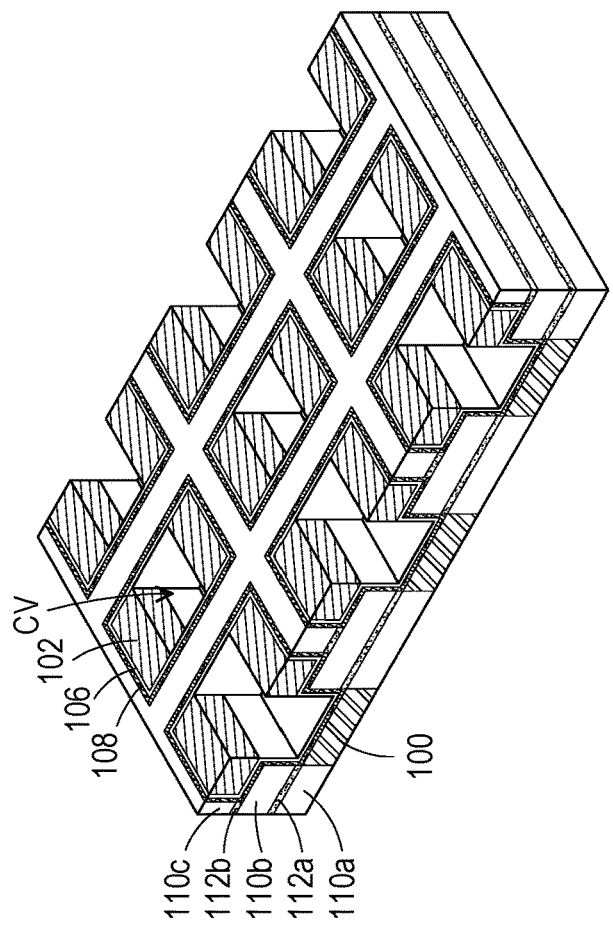

Referring to FIG. 3, FIG. 4K and FIG. 4L, at a step S310, the dielectric materials 400 are removed. As a result, a cavity CV is defined between the source/drain electrodes 102 of each pair. Subsequently, at a step S312, the channel layers 104 and the dielectric materials 114 are formed in the cavities CV. The resulting structure is shown in FIG. 1 and FIG. 2A. A method for forming the channel layers 104 and the dielectric materials 114 may include forming a channel material layer conformally covering the entire structure as shown in FIG. 4K and FIG. 4L, and filling up the cavities CV by an initial dielectric material. A planarization process may be used for removing portions of the channel material layer and the initial dielectric material over the top surface of the dielectric layer 110c. As a result, remained portions of the channel material layer may form the channel layers 104, and remained portions of the initial dielectric material may form the dielectric materials 114.

Up to here, the memory array 20 has been formed. Further processes may be performed on the memory array 20 to form conductive features for routing the memory array 20. For instance, these conductive features may include the source lines SL and the bit lines BL as shown in FIG. 2B.

Further, although the recesses RS for defining the cell regions of the memory array 20 are depicted as having vertical sidewalls, the recesses RS may be alternatively formed with oblique sidewalls or a combination of vertical and oblique sidewalls.

Figure 6A:
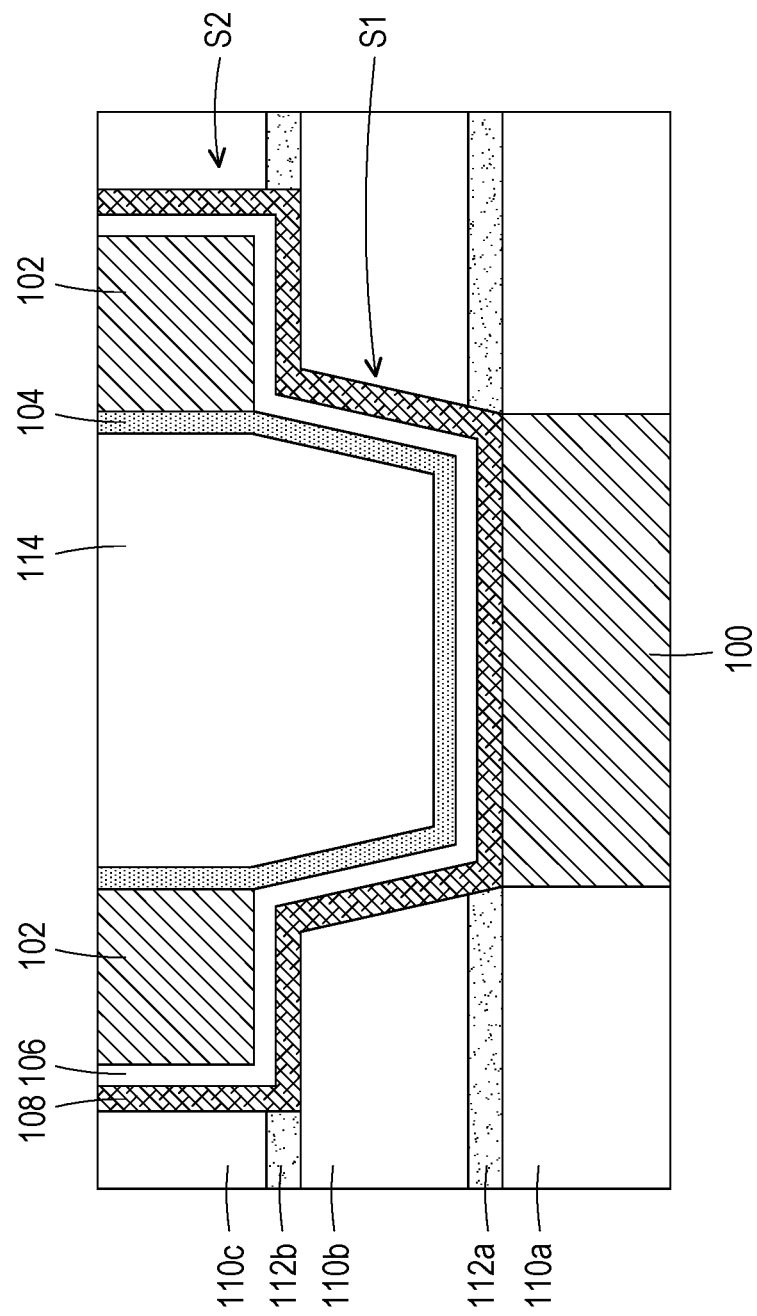
FIG. 6A through FIG. 6C are schematic cross-sectional views illustrating variations to sidewalls the cell region of each of the ferroelectric memory devices, according to some embodiments of the present disclosure.
Figure 6B:
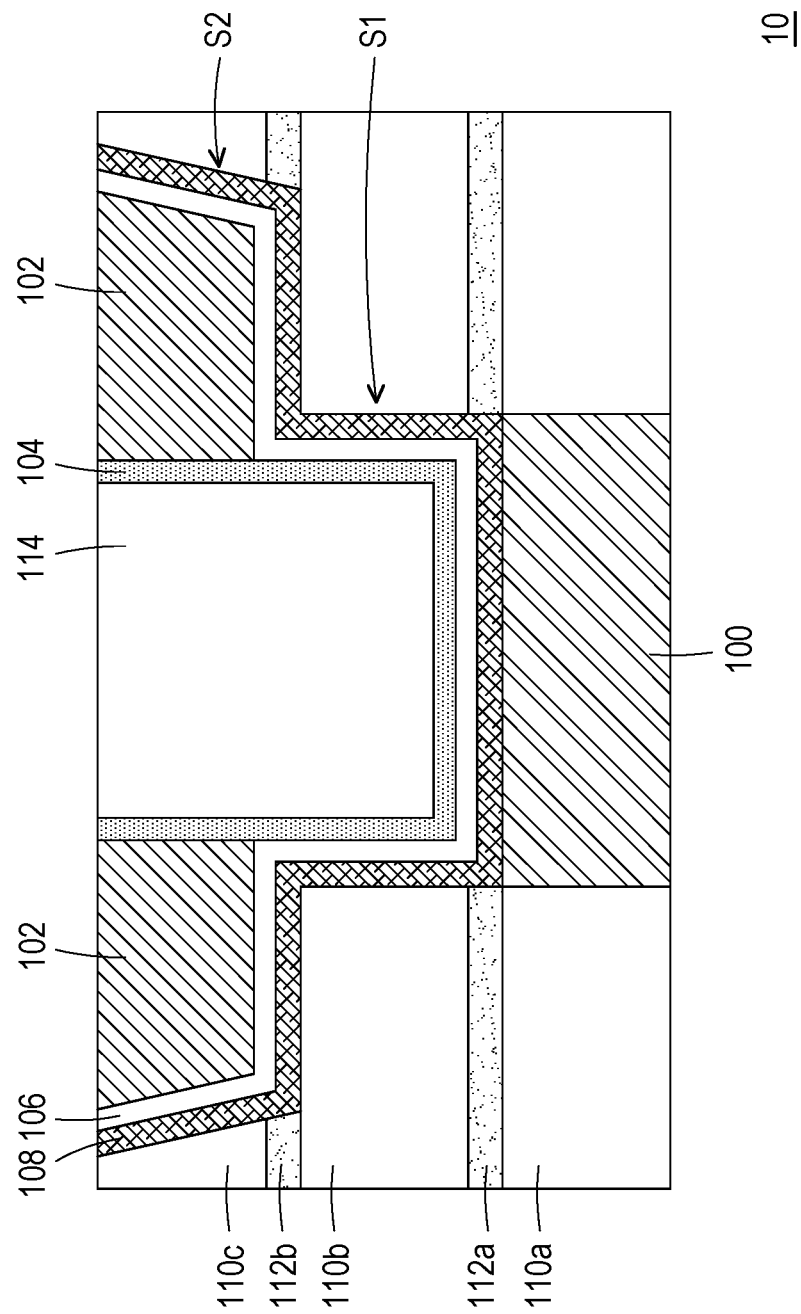
Figure 6C:
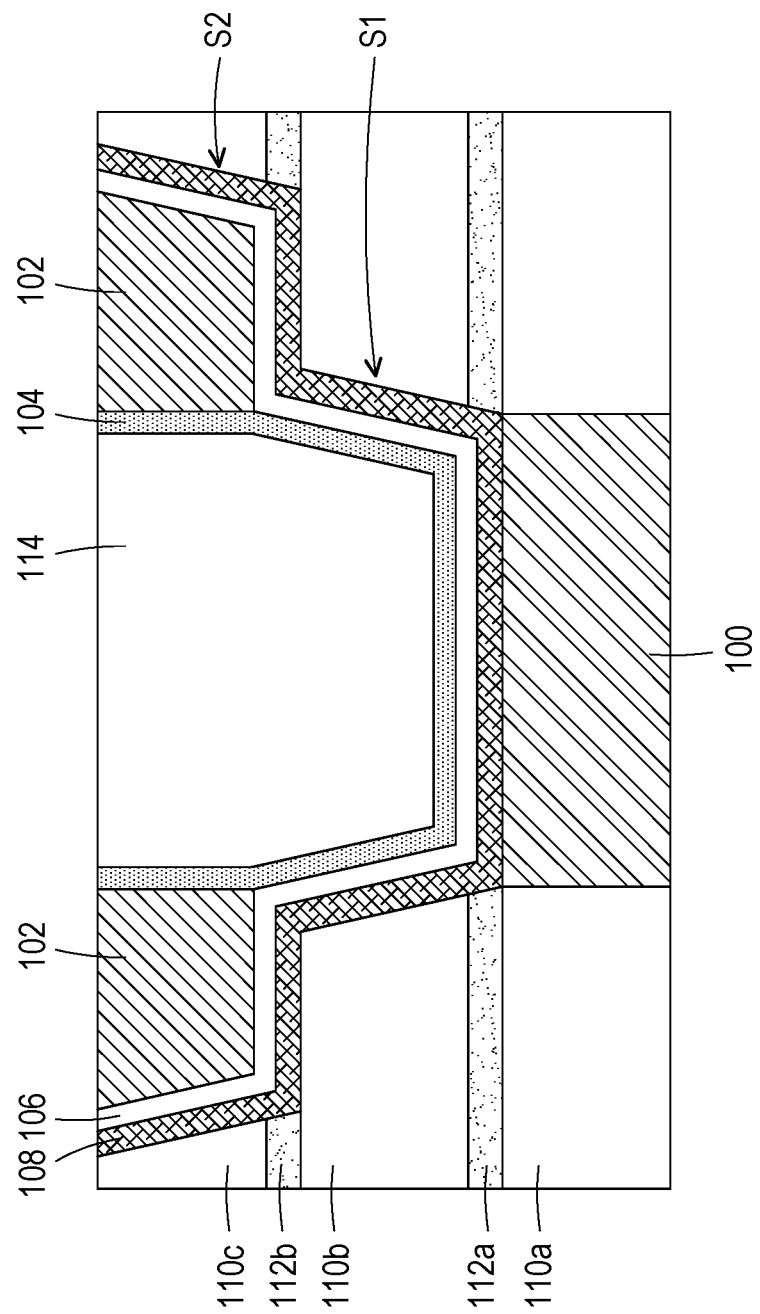

FIG. 6A through FIG. 6C are schematic cross-sectional views illustrating variations to sidewalls the cell region of each of the ferroelectric memory devices 10, according to some embodiments of the present disclosure.

Referring to FIG. 6A, in some embodiments, surfaces S1 extending through the dielectric layer 110b and the etching stop layer 112a and in lateral contact with the work function layer 108, the ferroelectric layer 106 and the channel layer 104 in each ferroelectric memory device 10 fan out away from the underlying word line 100. On the other hand, surfaces S2 extending through the dielectric layer 110c and the etching stop layer 112a and laterally surrounding the source/drain electrodes 102 in each ferroelectric memory device 10 may be close to or substantially vertical.

Referring to FIG. 6B, in some embodiments, the surfaces S1 defining a bottom part of the cell region of each ferroelectric memory device 10 are close to or substantially vertical. On the other hand, the surfaces S2 defining an upper part of the cell region of each ferroelectric memory device 10 may fan out toward the top surface of the dielectric layer 110c.

Referring to FIG. 6C, in some embodiments, both of the surfaces S1 and the surfaces S2 enclosing the cell region of each ferroelectric memory device 10 fan out away from the underlying word line 100.

As described above, an angle defined between each of the surfaces S1 and a vertical axis as well as an angle defined between each of the surfaces S2 and a vertical axis can be respectively adjusted. The present disclosure is not limited to a specific range of each of these angles. In addition to the variations of the sidewalls of the cell regions, further variations may be applied to the word lines 100.

Figure 7A:
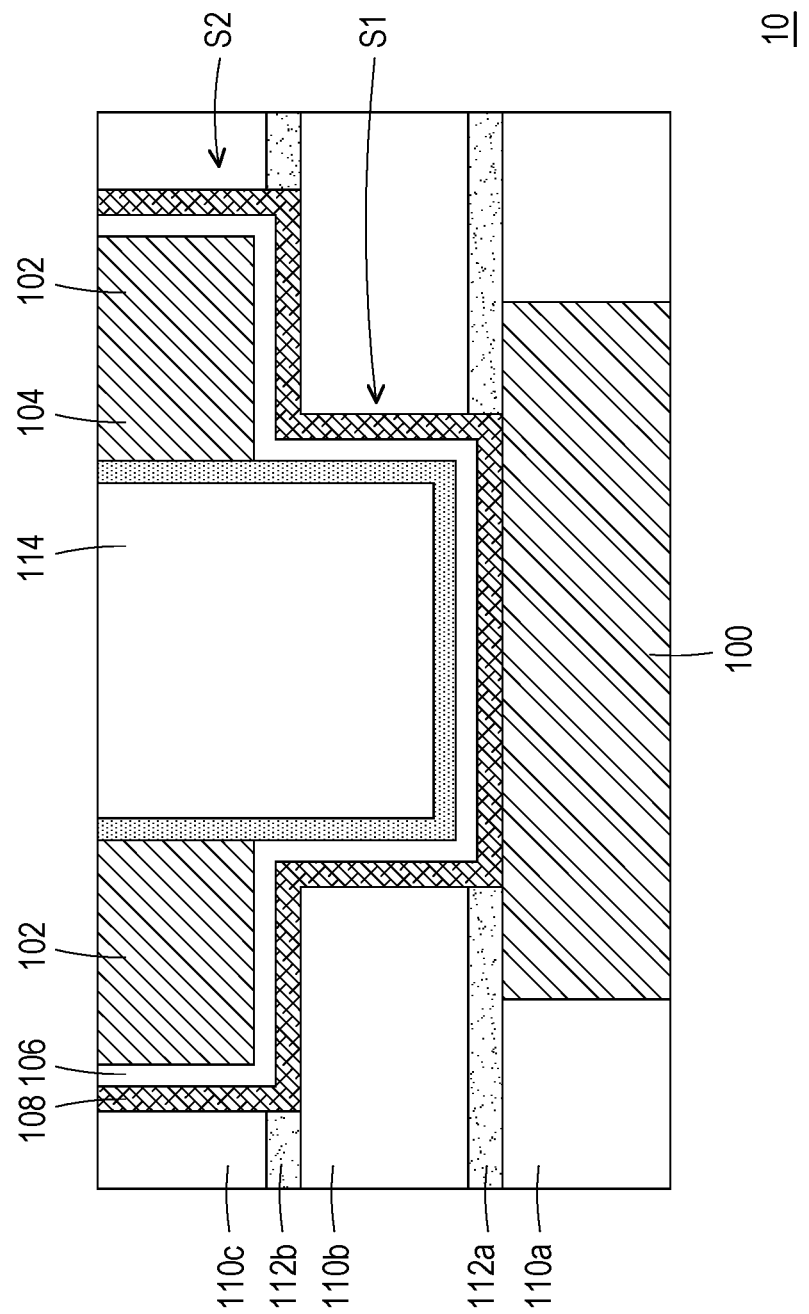
FIG. 7A through FIG. 7C are schematic cross-sectional views illustrating variations to word line of each ferroelectric memory device, according to some embodiments of the present disclosure.
Figure 7B:
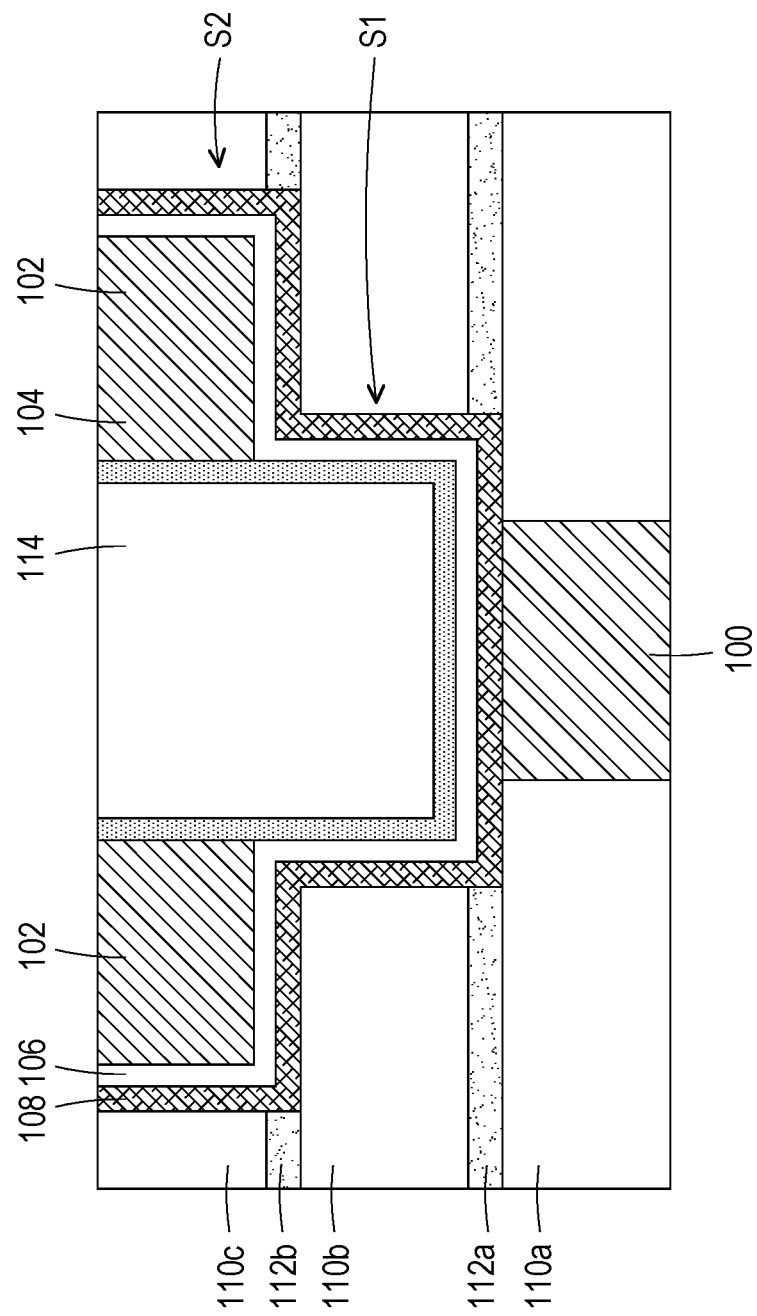
Figure 7C:
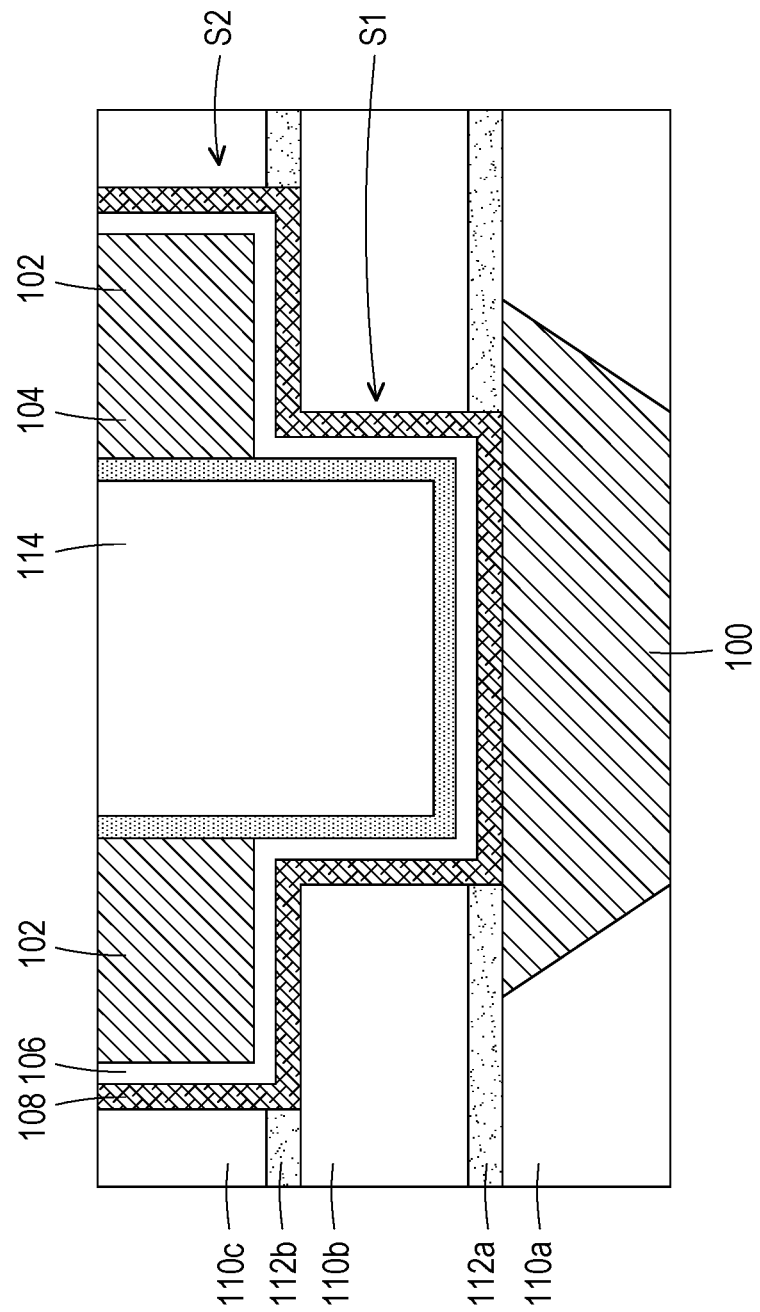

FIG. 7A through FIG. 7C are schematic cross-sectional views illustrating variations to the word line 100 of each ferroelectric memory device 10, according to some embodiments of the present disclosure.

According to the embodiments shown in FIG. 1 and FIG. 2A, a width of each word line 100 is substantially identical with a width of a bottom part of the overlying cell region enclosed by the etching stop layer 112a and the dielectric layer 110b, and opposite sidewalls of each word line 100 may be substantially aligned with opposite ones of the surfaces S1 laterally surrounding the bottom part of the overlying cell region. On the other hand, according to some embodiments shown in FIG. 7A, a width of each word line 100 is greater than a width of a bottom part of the overlying cell region enclosed by the etching stop layer 112a and the dielectric layer 110b, and opposite edge portions of each word line 100 may be laterally protruded with respect to the bottom part of the overlying cell region.

According to some embodiments shown in FIG. 7B, a width of each word line 100 is shorter than a width of a bottom part of the overlying cell region enclosed by the etching stop layer 112a and the dielectric layer 110b, and each word line 100 is laterally recessed with respect to the bottom part of the overlying cell region.

Furthermore, as shown in FIG. 7C, opposite sidewalls of each word line 100 in the dielectric layer 110a may fan out toward the etching stop layer 112a lying on the dielectric layer 110a. As an example, a maximum width of each word line 100 may be greater than a width of a bottom part of the overlying cell region enclosed by the etching stop layer 112a and the dielectric layer 110b, and a minimum width of each word line 100 may be substantially equal to, greater than or shorter than the width of the bottom part of the overlying cell region. Alternatively, the maximum width of each word line 100 may be substantially identical with or shorter than the width of the bottom part of the overlying cell region.

As described above, the width of each word line 100 as well as a tilt angle of the opposite sidewalls of each word line 100 can be altered. As will be described, further structural variations can be applied to each ferroelectric memory device 10.

Figure 8:
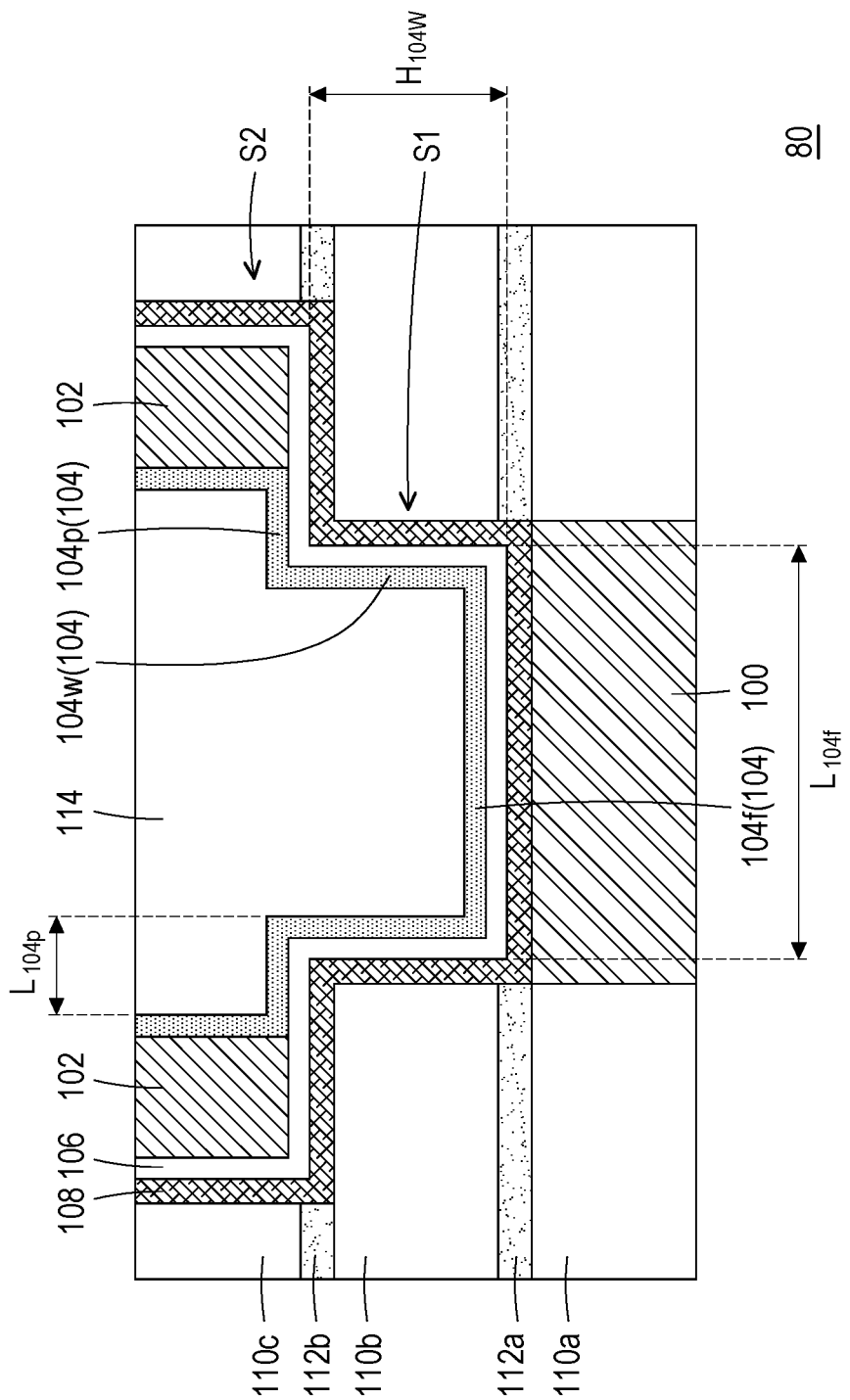
FIG. 8 is a schematic cross-sectional view illustrating a ferroelectric memory device, according to some embodiments of the present disclosure.

FIG. 8 is a schematic cross-sectional view illustrating a ferroelectric memory device 80, according to some embodiments of the present disclosure. The ferroelectric memory device 80 is similar to the ferroelectric memory device 10 described above, thus only differences between the ferroelectric memory devices 10, 80 will be discussed. The same or the like parts of the ferroelectric memory devices 10, 80 would not be repeated again.

Referring to FIG. 8, according to some embodiments, the source/drain electrodes 102 in each ferroelectric memory device 80 are laterally spaced apart from wall portions of the work function layer 108 and the ferroelectric layer 106 extending along opposite ones of the surfaces S1 cutting through the dielectric layer 110b and the etching stop layer 112a. Accordingly, some laterally spanning portions of the ferroelectric layer 106 in junction with top ends of the wall portions of the ferroelectric layer 106 may not be covered by the source/drain electrodes 102, and the channel layer 104 may further have two laterally spanning portions 104p extending along these laterally spanning portions of the ferroelectric layer 106 and connecting the wall portions 104w of the channel layer 104 to the source/drain electrodes 102. As a result, a channel length of the ferroelectric memory device 80 can be defined as a sum of the length $L_{104f}$ of the bottom planar portion 104f of the channel layer 104; two times of the height $H_{104w}$ by which the wall portions 104w of the channel layer 104 are capacitively coupled to the work function layer 108; and two times of a length $L_{104p}$ of each laterally spanning portion 104p of the channel layer 104. Therefore, by laterally recessing the source/drain electrodes 102, an even longer channel length may be resulted.

Although not shown, one or more of the variations described with reference to FIG. 6A through FIG. 6C and FIG. 7A through FIG. 7C can be applied to the ferroelectric memory device 80 as shown in FIG. 8. Further, a plurality of the ferroelectric memory devices 80 can be arranged and interconnected to form a memory array as similar to the memory array 20 described with reference to FIG. 2A and FIG. 2B. Moreover, a process for manufacturing the array of the ferroelectric memory devices 80 may be similar to the process as described with reference to FIG. 3, FIG. 4A through FIG. 4L and FIG. 5A through FIG. 5F, except that the source/drain electrodes 102 may be formed with smaller size in the step shown in FIG. 4I and FIG. 4J.

As the memory array according to various embodiments (e.g., each of the memory array including a plurality of the ferroelectric memory devices 10 and the array of the ferroelectric memory devices 80) can be formed in a BEOL structure of a semiconductor chip, a driving circuit for operating the memory array can be formed in a front-end-of-line (FEOL) structure lying below the BEOL structure, for saving a total footprint area of the memory array and the driving circuit.

Figure 9:
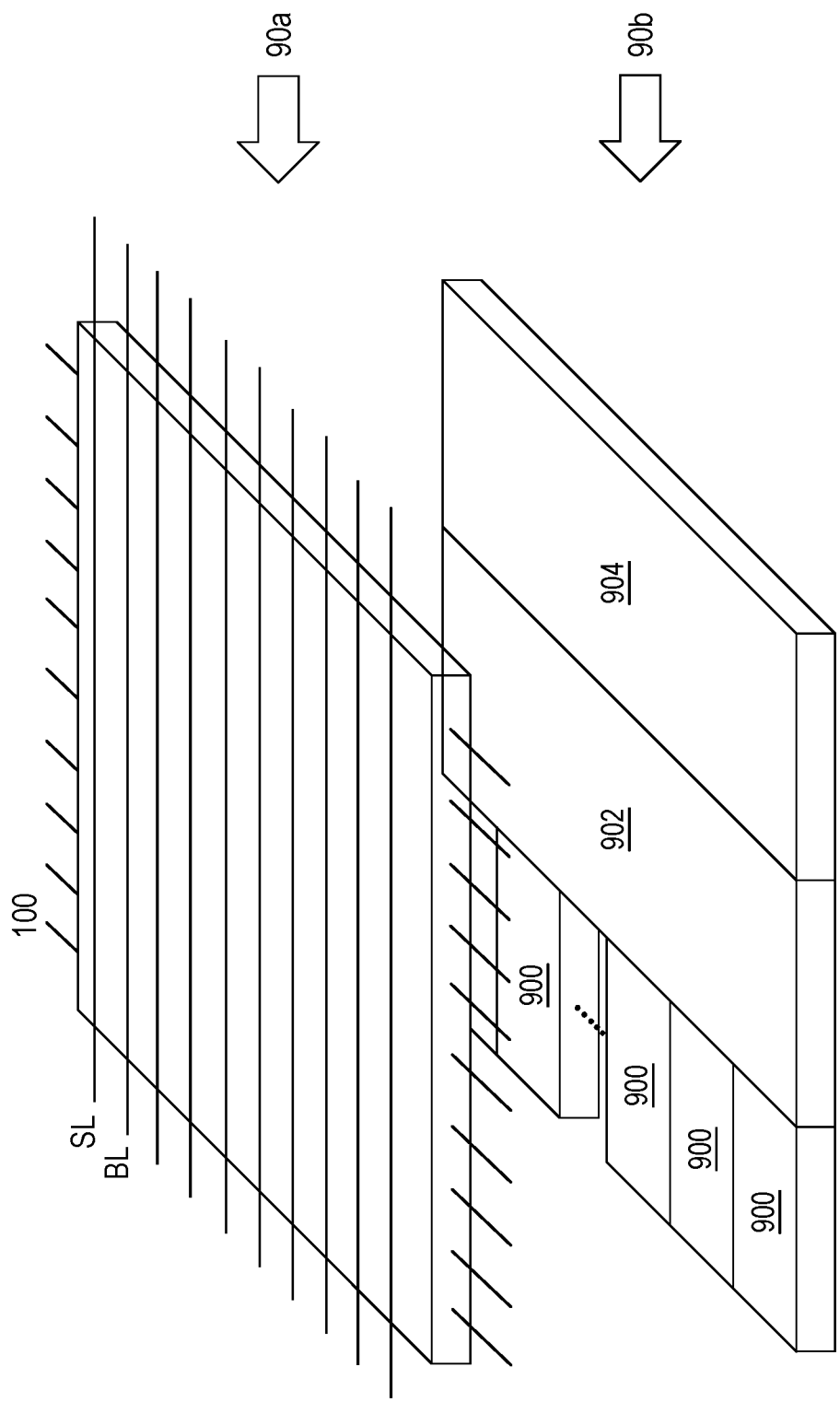
FIG. 9 is a schematic view illustrating a memory array and a driving circuit for operating the memory array, according to some embodiments of the present disclosure.

FIG. 9 is a schematic view illustrating a memory array 90a and a driving circuit 90b for operating the memory array 90a, according to some embodiments of the present disclosure.

The memory array 90a can be each of the memory array 20 as described with reference to FIG. 2A and FIG. 2B and an array of the ferroelectric memory devices 80 as shown in FIG. 8. The word lines 100 may extend through the memory array 90a along a first direction, while the source lines SL as well as the bit lines BL may extend across the memory array 90b along a second direction. Further, the word lines 100, the source lines SL and the bit lines BL are routed to the underlying driving circuit 90b. The driving circuit 90b may be overlapped with the memory array 90a, such that a total footprint area of the memory array 90a and the driving circuit 90b can be minimized. According to some embodiments, the driving circuit 90b includes sense amplifiers 900, a word line driving circuit 902 including an array of word line drivers (not shown) and other circuits 904. A floor plan of the driving circuit 90b shown in FIG. 9 is merely depicted for illustration purpose. Those skilled in the art may modify the floor plan of the driving circuit 902 according to design requirements, the present disclosure is not limited thereto.

Figure 10:
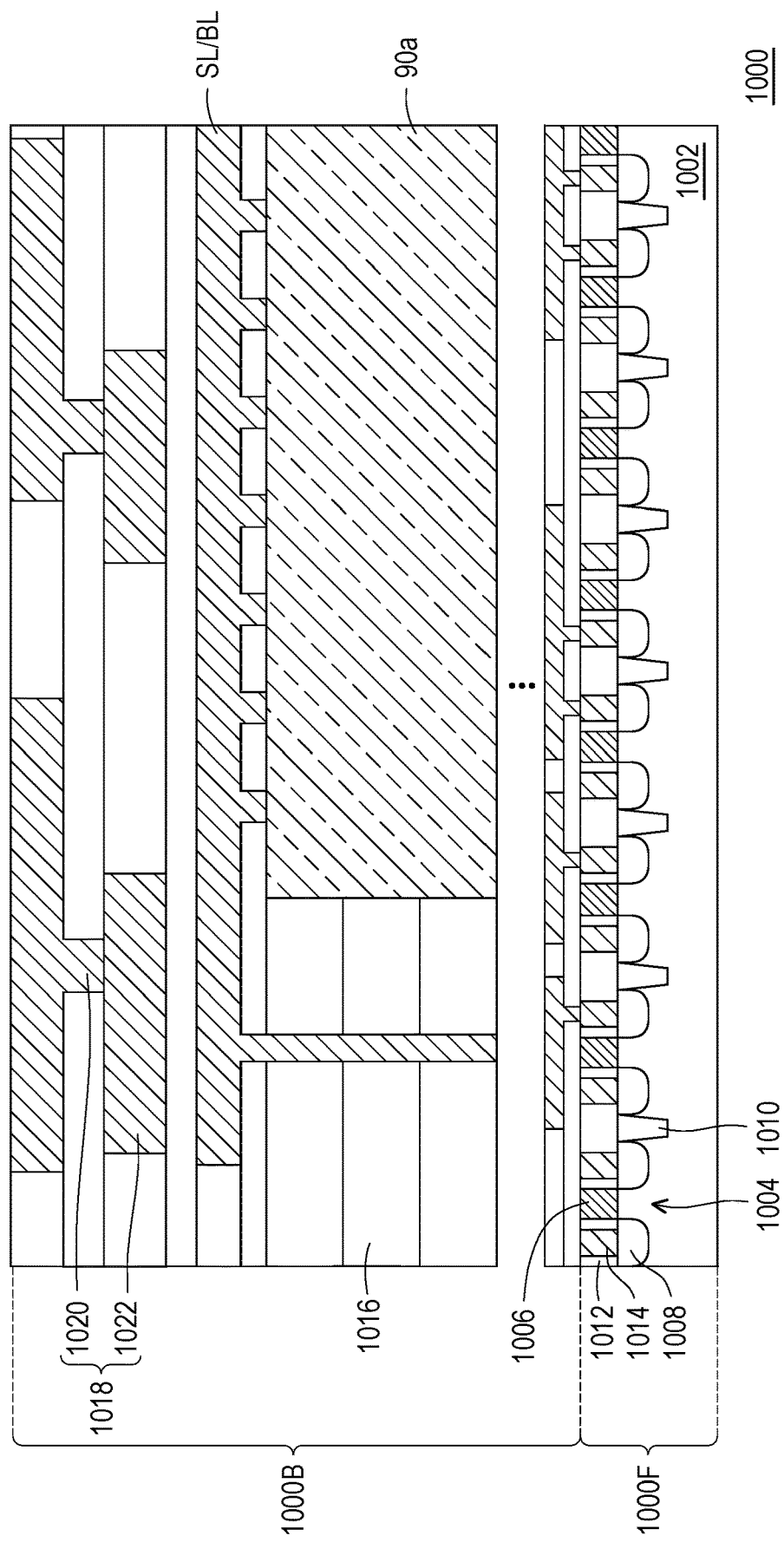
FIG. 10 is a schematic cross-sectional view illustrating a semiconductor chip, according to some embodiments of the present disclosure.

FIG. 10 is a schematic cross-sectional view illustrating a semiconductor chip 1000, according to some embodiments of the present disclosure.

Referring to FIG. 10, the semiconductor chip 1000 has a front-end-of-line (FEOL) structure 1000F built on a semiconductor substrate 1002, and includes a back-end-of-line (BEOL) structure 1000B disposed on the FEOL structure 1000F. The memory array 90a, which can be each of the memory array 20 as described with reference to FIG. 2A and FIG. 2B and an array of the ferroelectric memory devices 80 as shown in FIG. 8, is integrated in the BEOL structure 1000B.

The FEOL structure 1000F may include transistors (or referred to as front-end transistors) 1004. The transistors 1004 may be interconnected to form an integrated circuit, and the driving circuit 90b described with reference to FIG. 9 may be a part of the integrated circuit. Each of the transistors 1004 may include a gate structure 1006 and a pair of source/drain structures 1008 at opposite sides of the gate structure 1006. Further, adjacent transistors 1004 may be isolated from one another by an isolation structure 1010 formed in the semiconductor substrate 1002. In some embodiments, the transistors 1004 are planar type transistors. In these embodiments, the gate structures 1006 are formed on planar portions of the semiconductor substrate 1002, and the source/drain structures 1008 may be formed in the semiconductor substrate 1002. In alternative embodiments, the transistors 1004 are fin type transistors or gate-all-around (GAA) transistors. In these alternative embodiments, the semiconductor substrate 1002 may be shaped to form fin structures at its top surface, or stacks of channel structures (e.g., stacks of semiconductor nanosheets) may be formed on the semiconductor substrate 1002. Each fin structure/channel structure may extend between a pair of the source/drain structures 1008. In addition, the gate structures 1006 may intersect and cover the fin structures or the stacks of channel structures. Moreover, the FEOL structure 1000F may further include a dielectric layer 1012 and contact structures 1014 formed in the dielectric layer 1012. The contact structures 1014 penetrate through the dielectric layer 1012, to establish electrical contact with the source/drain structures 1008.

The BEOL structure 1000B may include a stack of interlayer dielectric layers 1016. Although not shown, etching stop layers may be inserted between the interlayer dielectric layers 1016. The memory array 90a is formed in a sub-stack of the interlayer dielectric layers 1016 and the etching stop layers. The dielectric layers 110 as described with reference to FIG. 1 and FIG. 2A may respectively be one of the interlayer dielectric layers 1016. Although not shown, the etching stop layers 112 as described with reference to FIG. 1 and FIG. 2A may respectively extend between two of the interlayer dielectric layers 1016. Further, the source lines SL and the bit lines BL (as described with reference to FIG. 2B and FIG. 9) extending across the memory array 90a may also be formed in the stack of dielectric layers 1016 (and the etching stop layers), along with other conductive features 1018. The source lines SL and the bit lines BL may run over the memory array 90a. The conductive features 1018 may be distributed below, around and over the memory array 90a, and may include conductive patterns 1020 and conductive vias 1022. The conductive patterns 1020 provide lateral conduction paths, whereas the conductive vias 1022 provide vertical conduction paths. The transistors 1004 in the FEOL structure 1000F may be interconnected through some of the conductive features 1018, and the memory array 90a may be routed to some of the transistors 1004 through others of the conductive elements 1018. Although not shown, passivation layer(s) and electrical connectors as chip inputs/outputs (I/Os) may be formed on the BEOL structure 1000B.

As above, a ferroelectric memory device, a memory array including a plurality of the ferroelectric memory device, a manufacturing method for forming the memory array and a semiconductor chip are provided. A word line is provided as a gate terminal of the ferroelectric memory device, and source/drain electrodes as source/drain terminals of the ferroelectric memory device are disposed at opposite sides of the word line and elevated from the word line. In this way, a channel layer capacitively coupled to the word line through a ferroelectric layer and connecting one of the source/drain electrodes to the other has a bottom planar portion extending along a top surface of the word line, and has wall portions connecting opposite ends the bottom planar portion to the elevated source/drain electrodes. A work function layer provided as an extension of the word line not only extends along the top surface of the word line, but further extends along the wall portions of the channel layer. As a result, in addition that the bottom planar portion of the channel layer can be capacitively coupled to the word line, the wall portions of the channel layer can be capacitively coupled to the word line via the work function layer. Therefore, a channel length is increased. By having a longer channel length, the ferroelectric memory device may be operated with lower off-current and fewer power consumption. Alternatively, when the ferroelectric memory device is further scaled that a length of the bottom planar portion of the channel layer is shortened, the conduction channel may still have a total length long enough for ensuring acceptable off-current and power consumption. Furthermore, the channel length of the ferroelectric memory device can be altered by adjusting a height difference between the word line and the source/drain electrodes.

In an aspect of the present disclosure, a ferroelectric memory device is provided. The ferroelectric memory device comprises: a word line; a pair of source/drain electrodes, disposed at opposite sides of the word line, and elevated from the word line; a channel layer, having a bottom planar portion and wall portions, wherein the bottom planar portion extends along a top surface of the word line, and opposite ends of the bottom planar portion are connected to sidewalls of the source/drain electrodes through opposite ones of the wall portions; a work function layer, electrically connected to the word line, and extending along the bottom planar portion and the wall portions of the channel layer; and a ferroelectric layer, separating the channel layer from the work function layer.

In another aspect of the present disclosure, a ferroelectric memory device is provided. The ferroelectric memory device comprises: a word line, formed in a first dielectric layer; a pair of source/drain electrodes, disposed on a second dielectric layer stacked over the first dielectric layer, and extending along opposite edges of a first opening extending to the word line through the second dielectric layer; a channel layer, having a bottom planar portion extending along a top surface of the word line, and having wall portions extending along sidewalls of the second dielectric layer enclosing the first opening, wherein opposite ends of the bottom planar portion of the channel layer are connected to sidewalls of the source/drain electrodes through opposite ones of the wall portions of the channel layer; a work function layer, extending along the top surface of the word line and the sidewalls of the second dielectric layer; and a ferroelectric layer, separating the channel layer from the work function layer.

In yet another aspect of the present disclosure, a memory array is provided. The memory array comprises: word lines, extending along a column direction; source/drain electrodes, arranged in pairs and elevated from the word lines, wherein the source/drain electrodes in each pair extend along opposite sides of one of the word lines; channel layers, each connecting one of the source/drain electrodes in a pair to the other, and having a bottom planar portion extending along a top surface of one of the word lines and wall portions standing on edges of the bottom planar portion; work function layers, each in electrical connection to one of the word lines, and respectively extending along the bottom planar portion and the wall portions of one of the channel layers; and ferroelectric layers, separating the channel layers from the work function layers, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A ferroelectric memory device, comprising:
   a word line;
   a pair of source/drain electrodes, disposed at opposite sides of the word line, and elevated from the word line;
   a channel layer, having a bottom planar portion and wall portions, wherein the bottom planar portion extends along a top surface of the word line, and opposite ends of the bottom planar portion are connected to sidewalls of the source/drain electrodes through opposite ones of the wall portions;
   a work function layer, electrically connected to the word line, and extending along the bottom planar portion and the wall portions of the channel layer; and
   a ferroelectric layer, separating the channel layer from the work function layer.

2. The ferroelectric memory device according to claim 1, wherein the wall portions of the channel layer are in lateral contact with the ferroelectric layer and the work function layer.

3. The ferroelectric memory device according to claim 1, wherein the ferroelectric layer and the work function layer further extend along bottom surfaces of the source/drain electrodes, and laterally surround the source/drain electrodes.

4. The ferroelectric memory device according to claim 1, wherein the channel layer is separated from the word line and wrapped around by the ferroelectric layer and the work function layer.

5. The ferroelectric memory device according to claim 1, wherein the channel layer is formed to a height substantially leveled with top surface of the source/drain electrodes.

6. The ferroelectric memory device according to claim 1, wherein the wall portions of the channel layer further extend along the sidewalls of the source/drain electrodes.

7. The ferroelectric memory device according to claim 1, wherein the source/drain electrodes are laterally spaced apart from the wall portions of the channel layer.

8. The ferroelectric memory device according to claim 7, wherein the channel layer further has laterally spanning portions laterally extending from top ends of the opposite ones of the wall portions to the sidewalls of the source/drain electrodes.

9. A ferroelectric memory device, comprising:
   a word line, formed in a first dielectric layer;
   a pair of source/drain electrodes, disposed on a second dielectric layer stacked over the first dielectric layer, and extending along opposite edges of a first opening extending to the word line through the second dielectric layer;
   a channel layer, having a bottom planar portion extending along a top surface of the word line, and having wall portions extending along sidewalls of the second dielectric layer enclosing the first opening, wherein opposite ends of the bottom planar portion of the channel layer are connected to sidewalls of the source/ drain electrodes through opposite ones of the wall portions of the channel layer;
a work function layer, extending along the top surface of the word line and the sidewalls of the second dielectric layer; and
a ferroelectric layer, separating the channel layer from the work function layer.

10. The ferroelectric memory device according to claim 9, wherein the source/drain electrodes are formed in a second opening penetrating through a third dielectric layer stacked on the second dielectric layer.

11. The ferroelectric memory device according to claim 10, wherein a central part of the second opening overlaps the first opening, and the source/drain electrodes opening are disposed at opposite sides of the central part of the second opening.

12. The ferroelectric memory device according to claim 10, wherein the ferroelectric layer and the work function layer further extend between the source/drain electrodes and the third dielectric layer.

13. The ferroelectric memory device according to claim 10, further comprising:
a first etching stop layer, extending between the first and second dielectric layers, wherein the first opening further penetrates through the first etching stop layer; and
a second etching stop layer, extending between the second and third dielectric layers, wherein the second opening further penetrates through the second etching stop layer.

14. The ferroelectric memory device according to claim 13, wherein the work function layer and the ferroelectric layer further extend along sidewalls of the first etching stop layer enclosing the first opening, and further extend along sidewalls of the second etching stop layer enclosing the second opening.

15. The ferroelectric memory device according to claim 10, further comprising:
a dielectric material, formed on the bottom planar portion of the channel layer and wrapped around by the wall portions of the channel layer.

16. A memory array, comprising:
word lines, extending along a column direction;
source/drain electrodes, arranged in pairs and elevated from the word lines, wherein the source/drain electrodes in each pair extend along opposite sides of one of the word lines;
channel layers, each connecting one of the source/drain electrodes in a pair to the other, and having a bottom planar portion extending along a top surface of one of the word lines and wall portions standing on edges of the bottom planar portion;
work function layers, each in electrical connection to one of the word lines, and respectively extending along the bottom planar portion and the wall portions of one of the channel layers; and
ferroelectric layers, separating the channel layers from the work function layers, respectively.

17. The memory array according to claim 16, wherein the ferroelectric layers further extend along bottom surfaces of the source/drain electrodes, and each laterally surround a pair of the source/drain electrodes and one of the channel layers connecting the pair of the source/drain electrodes.

18. The memory array according to claim 16, further comprising:
source lines and bit lines, extending over the source/drain electrodes along a row direction, wherein one of the source/drain electrodes in each pair is electrically connected to one of the source lines, while the other is electrically connected to one of the bit lines.

19. The memory array according to claim 16, wherein the word lines are elevated from a semiconductor substrate in a semiconductor chip.

20. The memory array according to claim 19, wherein a stack of dielectric layers are formed on the semiconductor substrate in the semiconductor chip, and the memory array is embedded in the stack of dielectric layers.

* * * * *